(12) United States Patent
Cho et al.

(10) Patent No.: US 12,532,454 B2
(45) Date of Patent: Jan. 20, 2026

(54) SEMICONDUCTOR DEVICE AND METHOD FOR FABRICATING THE SAME

(71) Applicant: SK hynix Inc., Gyeonggi-do (KR)

(72) Inventors: Chang Hyun Cho, Gyeonggi-do (KR); Myoung Jin Kang, Gyeonggi-do (KR); Jun Ha Kwak, Gyeonggi-do (KR); Jin Sun Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 413 days.

(21) Appl. No.: 18/340,032

(22) Filed: Jun. 23, 2023

(65) Prior Publication Data
US 2024/0064957 A1 Feb. 22, 2024

(30) Foreign Application Priority Data

Aug. 17, 2022 (KR) .................. 10-2022-0102396

(51) Int. Cl.
*H10B 12/00* (2023.01)
*H01L 23/00* (2006.01)
*H01L 25/065* (2023.01)
*H01L 25/18* (2023.01)
*H10B 80/00* (2023.01)

(52) U.S. Cl.
CPC ............ *H10B 12/30* (2023.02); *H01L 24/08* (2013.01); *H01L 25/0657* (2013.01); *H01L 25/18* (2013.01); *H10B 12/02* (2023.02); *H10B 80/00* (2023.02); *H01L 2224/08145* (2013.01); *H01L 2924/1431* (2013.01); *H01L 2924/1436* (2013.01)

(58) Field of Classification Search
None
See application file for complete search history.

(56) References Cited

U.S. PATENT DOCUMENTS

| | | | |
|---|---|---|---|
| 2017/0236746 A1* | 8/2017 | Yu | G11C 16/24 257/314 |
| 2019/0006376 A1 | 1/2019 | Ramaswamy | |
| 2019/0103407 A1 | 4/2019 | Kim et al. | |
| 2019/0164985 A1 | 5/2019 | Lee et al. | |
| 2019/0206869 A1 | 7/2019 | Kim et al. | |
| 2021/0036016 A1* | 2/2021 | Park | H10D 64/037 |
| 2022/0122974 A1* | 4/2022 | Ryu | H10B 12/30 |
| 2022/0246619 A1 | 8/2022 | Kim | |

* cited by examiner

Primary Examiner — Hung K Vu
(74) Attorney, Agent, or Firm — IP & T GROUP LLP

(57) ABSTRACT

A semiconductor device includes: a lower structure; a horizontal conductive line which is oriented horizontally over the lower structure; a data storage element which is disposed over the lower structure to be spaced from the horizontal conductive line; a vertical conductive line which is vertically oriented between the horizontal conductive line and the data storage element; a horizontal layer which is oriented horizontally between the horizontal conductive line and the data storage element, and including a recessed side which is disposed adjacent to the vertical conductive line; and a body contact portion oriented which is vertically oriented by penetrating the horizontal layer.

18 Claims, 34 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0102396, filed on Aug. 17, 2022, which is incorporated herein by reference in its entirety.

BACKGROUND

1. Field

Various embodiments of the present invention relate to a semiconductor device, and more particularly, to a semiconductor device including memory cells that are arranged in three dimensions, and a method for fabricating the same.

2. Description of the Related Art

Recently, in order to cope with the increase in capacity and miniaturization of memory devices, a technique for providing a three-dimensional (3D) memory device in which a plurality of memory cells are stacked has been proposed.

SUMMARY

Embodiments of the present invention are directed to a semiconductor device including memory cells capable of realizing high integration and high operating speed, and a method for fabricating the semiconductor device.

In accordance with an embodiment of the present invention, a semiconductor device includes: a lower structure; a horizontal conductive line which is oriented horizontally over the lower structure; a data storage element which is disposed over the lower structure to be spaced from the horizontal conductive line; a vertical conductive line which is vertically oriented between the horizontal conductive line and the data storage element; a horizontal layer which is oriented horizontally between the horizontal conductive line and the data storage element, and including a recessed side which is disposed adjacent to the vertical conductive line; and a body contact portion oriented which is vertically oriented by penetrating the horizontal layer.

In accordance with another embodiment of the present invention, a method for fabricating a semiconductor device includes: forming an alternating stack of cell isolation layers and horizontal layers over a lower structure; forming a cell stack structure and an isolation structure in the alternating stack; forming a vertical opening in the cell stack structure to form recessed sides on a first side of the cell stack structure; forming a vertical conductive line filling the vertical opening and disposed adjacent to the recessed sides; forming a horizontal conductive line coupled to first ends of the horizontal layers of the cell stack structure; forming data storage elements which are coupled to second ends of the horizontal layers; and forming a body contact portion to vertically penetrate the cell stack structure. The forming of the vertical opening in the cell stack structure, the recessed sides include a first recessed side and a second recessed side that are facing each other. The forming of the vertical conductive line, the vertical conductive line includes a first vertical conductive line disposed adjacent to the first recessed side and a second vertical conductive line disposed adjacent to the second recessed side. The body contact portion includes a conductive material. The body contact portion includes a semiconductor material, a metal, a metal nitride, a metal silicide, or a combination thereof. A cross section of the recessed side includes a round shape, a bent shape, or an angled shape. The data storage element includes a capacitor. The horizontal layer includes a semiconductor material, an oxide semiconductor material, monocrystalline silicon, polycrystalline silicon, or a combination thereof.

In accordance with another embodiment of the present invention, a method for fabricating a semiconductor device includes: forming a memory cell array in a first substrate; forming a peripheral circuit portion in a second substrate; and bonding the first substrate and the second substrate through a bonding structure, wherein the forming of the memory cell array includes: forming an alternating stack of cell isolation layers and horizontal layers; forming a cell stack structure and an isolation structure in the alternating stack; forming a vertical opening in the cell stack structure to form recessed sides on a first side of the cell stack structure; forming a vertical conductive line filling the vertical opening to be disposed adjacent to the recessed sides; forming a horizontal conductive line coupled to first ends of the horizontal layers of the cell stack structure; forming data storage elements which are coupled to second ends of the horizontal layers; and forming a body contact portion to vertically penetrate the cell stack structure.

In accordance with another embodiment of the present invention, a semiconductor device includes: a lower structure; and a memory cell array, wherein the memory cell array includes: horizontal conductive lines that are disposed in a direction perpendicular to the lower structure; data storage elements that are spaced apart from the horizontal conductive lines; vertical conductive lines that are vertically oriented between the horizontal conductive lines and the data storage elements; horizontal layers that are horizontally oriented between the horizontal conductive lines and the data storage elements, and include the recessed sides that are disposed adjacent to the vertical conductive lines; and a body contact portion which is vertically oriented to penetrate the horizontal layers.

In accordance with another embodiment of the present invention, a semiconductor device includes: a lower structure; a three-dimensional array including column arrays of recessed channel transistors that are vertically oriented over the lower structure; and a vertical body contact portion oriented vertically over the lower structure and commonly coupled to the recessed channel transistors of the column arrays of the three-dimensional array, wherein each of the recessed channel transistors of the column arrays of the 3D array includes a horizontal recessed channel and a common vertical gate line.

In accordance with another embodiment of the present invention, a semiconductor device includes: a lower structure; a first conductive line extending over and in parallel to a top surface of the lower structure; a data storage element disposed over the lower structure; a second conductive line extending vertically over the lower structure and disposed between the first conductive line and the data storage element; a horizontal layer oriented in parallel to the top surface of the lower structure between the first conductive line and the data storage element, and including a recessed side which is disposed adjacent to the vertical conductive line; and a body contact portion passing through the horizontal layer and vertically oriented.

These and other features and advantages of the present invention will become apparent to the skilled person from the following figures and detailed description.

DETAILED DESCRIPTION

Figure 1:
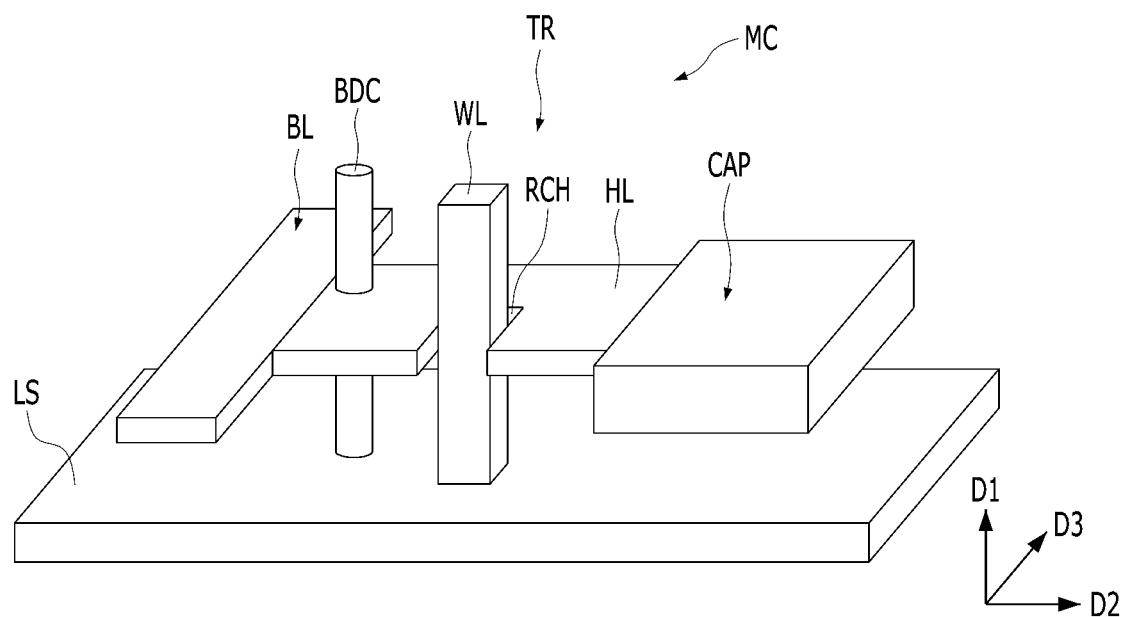
FIG. 1 is a schematic perspective view illustrating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
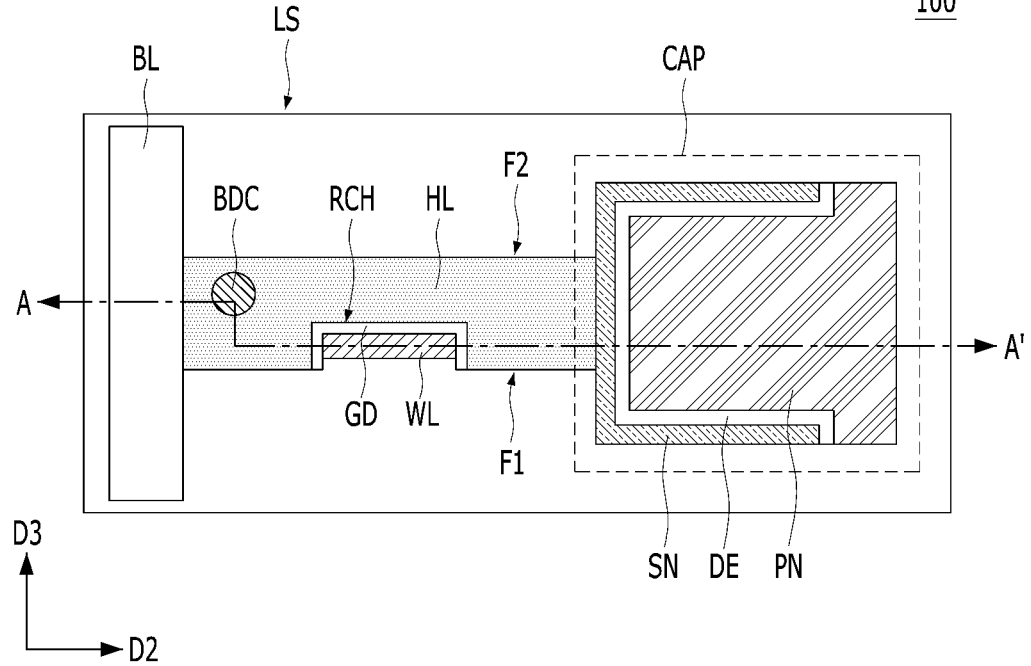
FIG. 2 is a schematic plan view illustrating the semiconductor device shown in FIG. 1.
Figure 3:
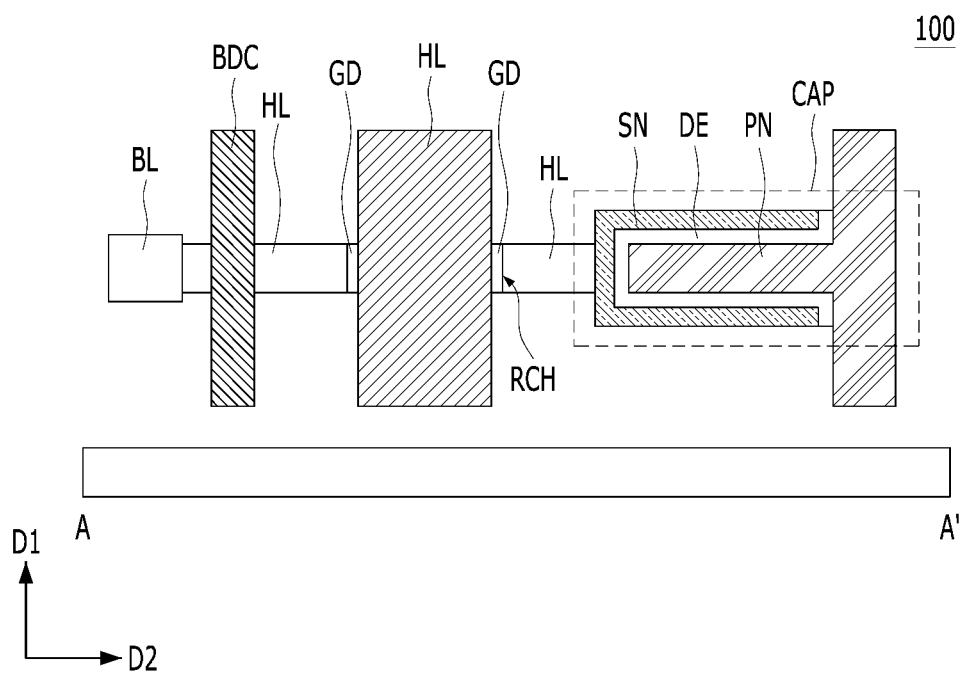
FIG. 3 is a schematic cross-sectional view illustrating a semiconductor device taken along a line A-A' of FIG. 2.

FIG. 1 is a schematic perspective view illustrating a semiconductor device in accordance with an embodiment of the present invention. FIG. 2 is a schematic plan view illustrating the semiconductor device shown in FIG. 1. FIG. 3 is a schematic cross-sectional view illustrating a semiconductor device taken along a line A-A' of FIG. 2. FIGS. 4A to 4L are plan views illustrating diverse modifications of a vertical conductive line.

Referring to FIGS. 1 to 3, the semiconductor device 100 may include a lower structure LS, a horizontal conductive line BL horizontally oriented over the lower structure LS, a data storage element CAP disposed over the lower structure LS to be spaced apart from the horizontal conductive line BL, a vertical conductive line WL oriented vertically between the horizontal conductive line BL and the data storage element CAP, a horizontal layer HL horizontally orientated between the horizontal conductive line BL and the data storage element CAP and including a recessed side RCH which is disposed adjacent to the vertical conductive line WL, and a body contact portion BDC vertically oriented to penetrate the horizontal layer HL.

The vertical conductive line WL may be vertically oriented in a first direction D1, and the horizontal layer HL may be horizontally oriented in a second direction D2. The horizontal conductive line BL may be horizontally oriented in a third direction D3. The first direction D1 and the second direction D2 may cross each other perpendicularly, and the third direction D3 may perpendicularly cross the first and second directions D1 and D2.

The horizontal layer HL may be horizontally oriented in the second direction D2 between the horizontal conductive line BL and the data storage element CAP. The horizontal conductive line BL may be coupled to a first end of the horizontal layer HL, and the data storage element CAP may be coupled to a second end opposite to the first end of the horizontal layer HL. The horizontal layer HL may include at least one recessed side RCH. The recessed side RCH may be referred to as a recessed channel.

The horizontal layer HL and the vertical conductive line WL may form a switching element TR, such as a transistor. The switching element TR may also be referred to as an access element or a select element.

The semiconductor device 100 may include memory cells MC, and each of the memory cells MC may include one switching element TR and one data storage element CAP. For example, when the switching element TR is a transistor and the data storage element CAP is a capacitor, the memory cell MC may have a 1T-1C (1 Transistor-1 Capacitor) structure. In each of the memory cells MC, the horizontal conductive line BL may include a bit line, and the vertical conductive line WL may include a word line or a gate line. The data storage element CAP may include a memory element, such as a capacitor.

The switching element TR may include a horizontal layer HL, a dielectric layer GD, and a vertical conductive line WL. The vertical conductive line WL may be a single conductive line. When the switching element TR includes a transistor, the horizontal layer HL may include an active layer, and the dielectric layer GD may include a gate dielectric layer, and the vertical conductive line WL may include a vertical gate line.

The data storage element CAP may include a first electrode SN, a second electrode PN, and a dielectric layer DE disposed between the first electrode SN and the second electrode PN.

The vertical conductive line WL may extend in the first direction D1 which is perpendicular to the surface of the lower structure LS. The horizontal layer HL may extend horizontally in the second direction D2 which is parallel to the surface of the lower structure LS. The horizontal conductive line BL may extend horizontally in the third direction D3 which is parallel to the surface of the lower structure LS.

The vertical conductive line WL may be vertically oriented in the first direction D1. The vertical conductive line WL may be referred to as a vertically oriented word line or a vertically oriented gate line. The vertical conductive line WL may include a conductive material. The vertical conductive line WL may include a silicon-based material, a metal-based material, or a combination thereof. The vertical conductive line WL may include, for example, polysilicon, a metal, a metal nitride, a metal silicide, or a combination thereof. The vertical conductive line WL may include, for example, polysilicon, titanium nitride, tungsten, or a combination thereof. For example, the vertical conductive line WL may include polysilicon or titanium nitride (TiN) which is doped with an N-type impurity. The vertical conductive line WL may include a stack (TiN/W) of titanium nitride and tungsten.

The dielectric layer GD may be formed over the recessed side RCH of the horizontal layer HL. The dielectric layer GD may be disposed between the recessed side RCH and the vertical conductive line WL. The dielectric layer GD may include, for example, silicon oxide, silicon nitride, a high-k material, a ferroelectric material, an antiferroelectric material, or a combination thereof.

The horizontal conductive line BL may extend horizontally in the third direction D3. The horizontal conductive line BL may be referred to as a horizontally oriented bit line. The horizontal conductive line BL may include a conductive material. The horizontal conductive line BL may include a silicon-based material, a metal-based material, or a combination thereof. The horizontal conductive line BL may include, for example, polysilicon, a metal, a metal nitride, a metal silicide, or a combination thereof. The horizontal conductive line BL may include, for example, polysilicon, titanium nitride, tungsten, or a combination thereof. For example, the horizontal conductive line BL may include, for example, polysilicon or titanium nitride (TiN) which is doped with an N-type impurity. The horizontal conductive line BL may include a stack of titanium nitride and tungsten (TiN/W).

The horizontal layer HL may be spaced apart from the lower structure LS and extend in the second direction D2 which is parallel to the surface of the lower structure LS. The horizontal layer HL may include a semiconductor material. For example, the horizontal layer HL may include polysilicon, monocrystalline silicon, germanium, or silicon-germanium. According to another embodiment of the present invention, the horizontal layer HL may include an oxide semiconductor material. For example, the oxide semiconductor material may include indium gallium zinc oxide (IGZO). The horizontal layer HL may be referred to as an active layer or a thin-body active layer.

The top and bottom surfaces of the horizontal layer HL may be flat-surfaces. The top and bottom surfaces of the horizontal layer HL may be parallel to each other in the second direction D2 and may face each other in the first direction D1. The horizontal layer HL may further include a first side F1 and a second side F2 between the top surface and the bottom surface. The first side F1 and the second side F2 may face each other in the third direction D3. The first side F1 may include a flat side and a recessed side RCH, and the second side F2 may include a fully-flat side. The fully-flat side may refer to a structure in which the flat side is continuous without including a recessed side RCH.

A cross-section of the recessed side RCH may have a rectangular shape. As illustrated in FIGS. 4A to 4L, the cross section of the recessed side RCH may include a bent shape, an angular shape, or a round shape. A cross section of the vertical conductive line WL may be triangular, polygonal, or hemispherical.

Figure 4A:
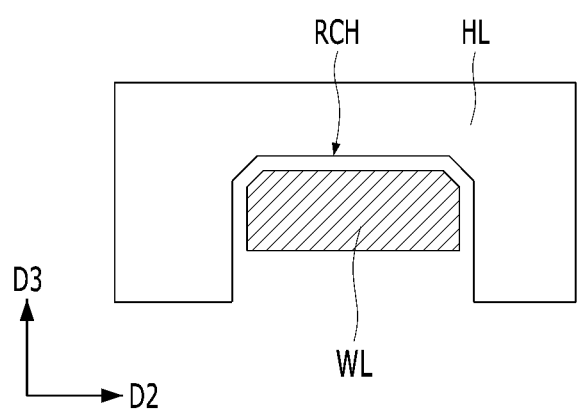
FIGS. 4A to 4L are plan views illustrating diverse modifications of a vertical conductive line.
Figure 4B:
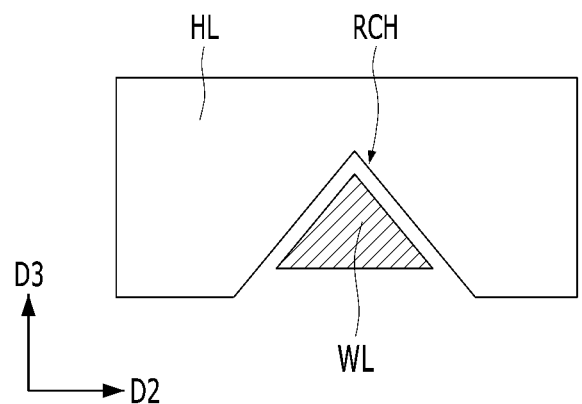
Figure 4C:
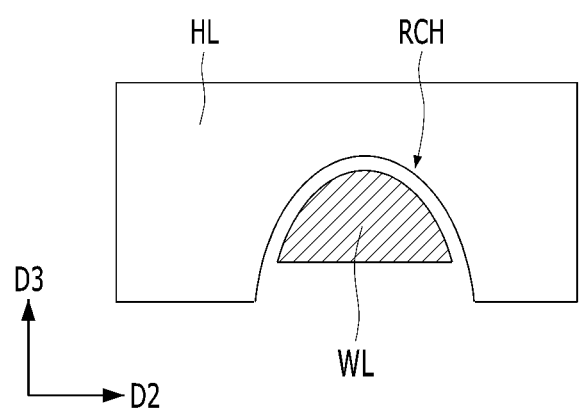
Figure 4D:
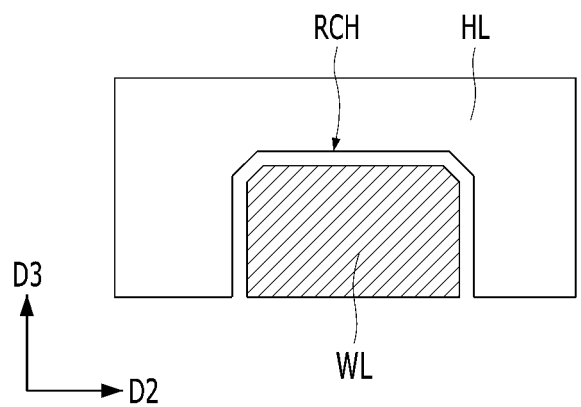
Figure 4E:
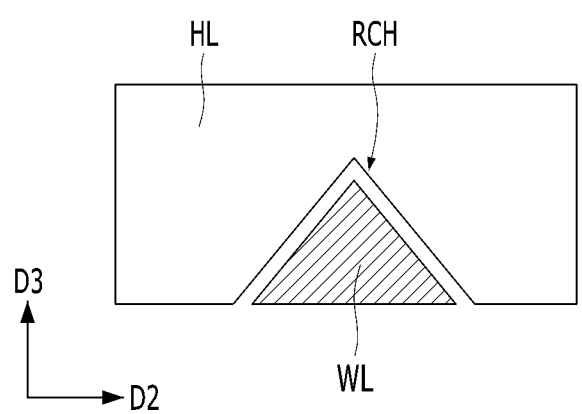
Figure 4F:
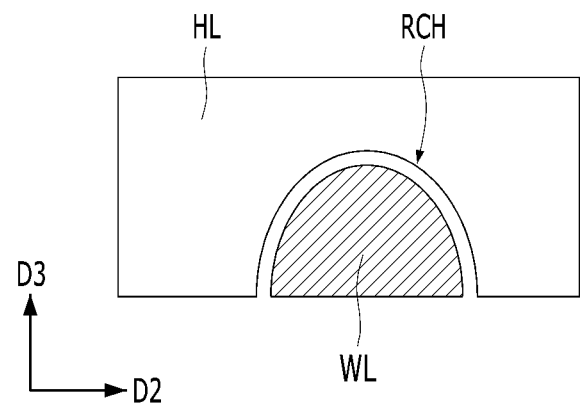
Figure 4G:
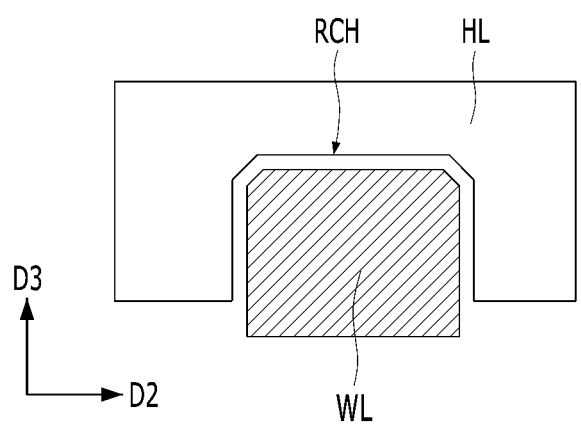
Figure 4H:
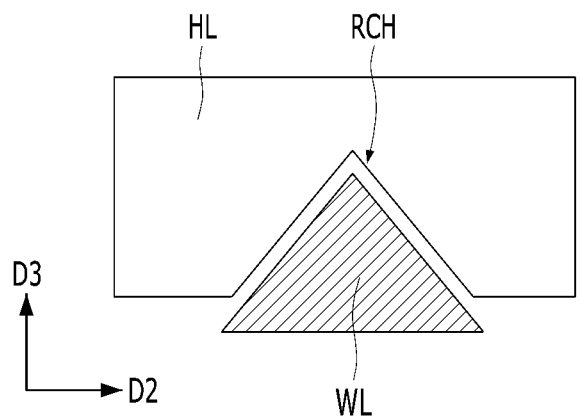
Figure 4I:
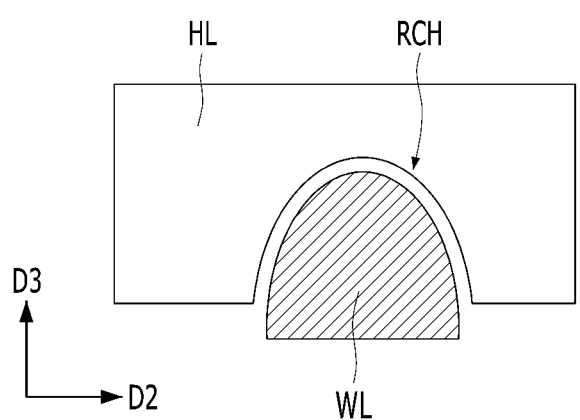
Figure 4J:
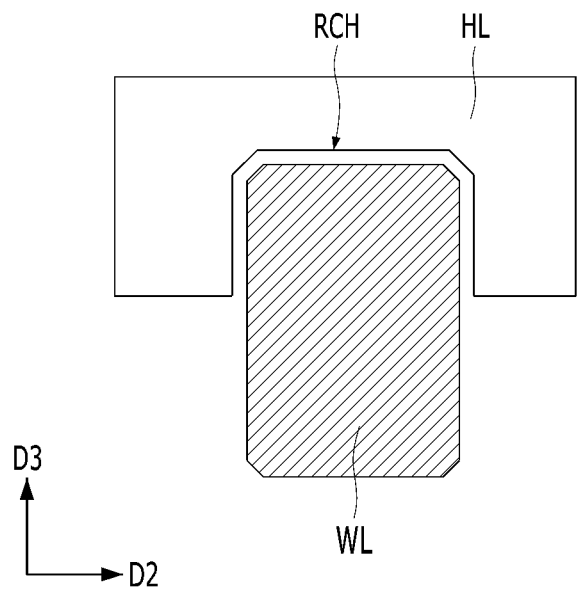
Figure 4K:
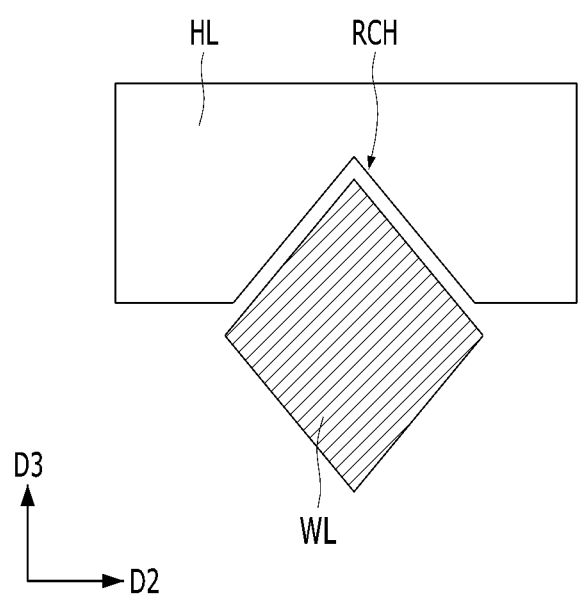
Figure 4L:
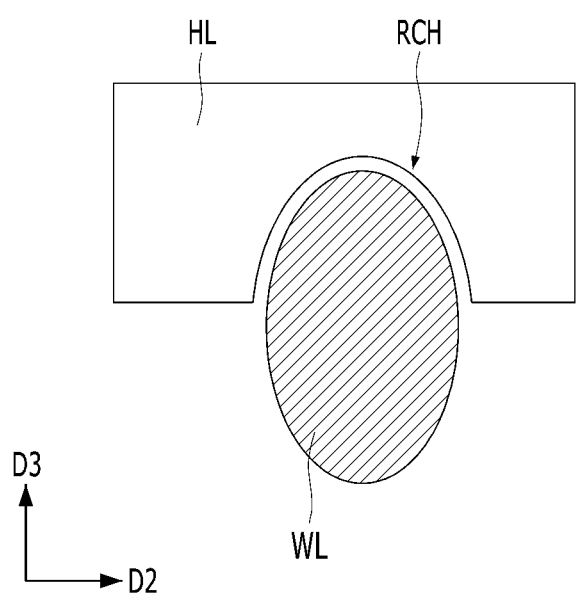

The vertical conductive line WL may have an embedded shape or a protruding shape. For example, as illustrated in FIGS. 4A to 4F, from a top view perspective, the vertical conductive line WL may have an embedded shape disposed in the recessed side RCH of the horizontal layer HL. According to another embodiment of the present invention, as illustrated in FIGS. 4G to 4L, a portion of the vertical conductive line WL may be disposed in the recessed side RCH of the horizontal layer HL, and another portion of the vertical conductive line WL may be disposed in the outside of the recessed side RCH. FIGS. 4G to 4I illustrate a partially protruding vertical conductive line WL. FIGS. 4J to 4L show a fully protruding vertical conductive line WL. In FIGS. 4A to 4L, an embedded shape, a partially protruding shape, or a fully protruding shape may be defined according to the size of the width of the vertical conductive line WL in the third direction D3.

The body contact portion BDC may extend in the first direction D1 by penetrating a portion of the horizontal layer HL. The body contact portion BDC and the horizontal layer HL are electrically connected. The body contact portion BDC may include a conductive material. The body contact portion BDC may include a silicon-based material, a metal-based material, or a combination thereof. The body contact portion BDC may include a semiconductor material, a metal, a metal nitride, a metal silicide, or a combination thereof. The body contact portion BDC may include, for example, polysilicon, titanium nitride, tungsten, or a combination thereof. For example, the body contact portion BDC may include polysilicon or titanium nitride (TiN) which is doped with an N-type impurity. The body contact portion BDC may include a stack (TiN/W) of titanium nitride and tungsten. A body bias may be applied to the horizontal layer HL through the body contact portion BDC, and thus a floating body effect may be suppressed.

The data storage element CAP may be horizontally disposed in the second direction D2 from the switching element TR. The data storage element CAP may include a first electrode SN horizontally extending from the horizontal layer HL in the second direction D2. The data storage element CAP may further include a second electrode PN over the first electrode SN, and a dielectric layer DE disposed between the first electrode SN and the second electrode PN. The first electrode SN, the dielectric layer DE, and the second electrode PN may be horizontally arranged in the second direction D2. The first electrode SN may have a horizontally oriented cylinder-shape. The dielectric layer DE may conformally cover the inner wall of the cylindrical shape of the first electrode SN, and the second electrode PN may fill the cylindrical inside of the first electrode SN over the dielectric layer DE. According to another embodiment of the present invention, the dielectric layer DE may conformally cover the inner wall and the cylinder outer wall of the cylindrical inside of the first electrode SN, and the second electrode PN may cover the inner wall and the cylinder outer wall of the cylindrical inside of the first electrode SN over the dielectric layer DE.

The first electrode SN may have a three-dimensional structure, and the first electrode SN of the three-dimensional structure may have a horizontal three-dimensional structure which is oriented in the second direction D2. As an example of the three-dimensional structure, the first electrode SN may have a cylinder shape. According to another embodiment of the present invention, the first electrode SN may have a pillar shape or a pylinder shape. The pylinder shape may refer to a structure in which a pillar shape and a cylinder shape are merged.

The first electrode SN and the second electrode PN may include a metal, a noble metal, a metal nitride, a conductive metal oxide, a conductive noble metal oxide, a metal carbide, a metal silicide, or a combination thereof. For example, the first electrode SN and the second electrode PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The second electrode PN may include a combination of a metal-based material and a silicon-based material. For example, the second electrode PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material that fills the cylindrical inside of the first electrode SN, and titanium nitride (TiN) may serve as a second electrode PN of a data storage element CAP, whereas tungsten nitride may be a low-resistance material.

The dielectric layer DE may include, for example, silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of zirconium (Zr)-based oxide. The dielectric layer DE may have a stack structure including at least zirconium oxide ($ZrO_2$). The dielectric layer DE may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide ($ZrO_2$)-based layer. According to another embodiment of the present invention, the dielectric layer DE may be formed of hafnium (Hf)-based oxide. The dielectric layer DE may have a stack structure including at least hafnium oxide ($HfO_2$). The dielectric layer DE may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide ($HfO_2$)-based layer. In the ZA stack, ZAZ stack, HA stack, and HAH stack, aluminum oxide ($Al_2O_3$) may have a greater bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high-bandgap material having a greater bandgap than the high-k material. The dielectric layer DE may include, for example, silicon oxide ($SiO_2$) as a high bandgap material other than aluminum oxide ($Al_2O_3$). Since the dielectric layer DE includes a high bandgap material, leakage current may be suppressed. The high-bandgap material may be thinner than the high-k material. According to another embodiment of the present invention, the dielectric layer DE may include a laminated structure in which a high-k material and a high-bandgap material are alternately stacked. For example, the dielectric layer DE may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/HfO_2$) stack. In the above laminated structure, aluminum oxide ($Al_2O_3$) may be thinner than zirconium oxide ($ZrO_2$) and hafnium oxide ($HfO_2$).

According to another embodiment of the present invention, the dielectric layer DE may include a stack structure, a laminated structure, or a mixed structure including zirconium oxide, hafnium oxide, and aluminum oxide.

According to another embodiment of the present invention, the dielectric layer DE may include a ferroelectric material or an antiferroelectric material.

According to another embodiment of the present invention, an interface control layer for improving leakage current may be further formed between the first electrode SN and the dielectric layer DE. The interface control layer may include titanium oxide ($TiO_2$), niobium oxide, or niobium nitride. The interface control layer may also be formed between the second electrode PN and the dielectric layer DE.

The data storage element CAP may include a metal-insulator-metal (MIM) capacitor. The first electrode SN and the second electrode PN may include a metal-based material.

The data storage element CAP may be replaced with another data storage material. For example, the data storage material may be a phase change material, a magnetic tunnel junction (MTJ), or a variable resistance material.

The lower structure LS may include a semiconductor substrate or a peripheral circuit portion.

Figure 5A:
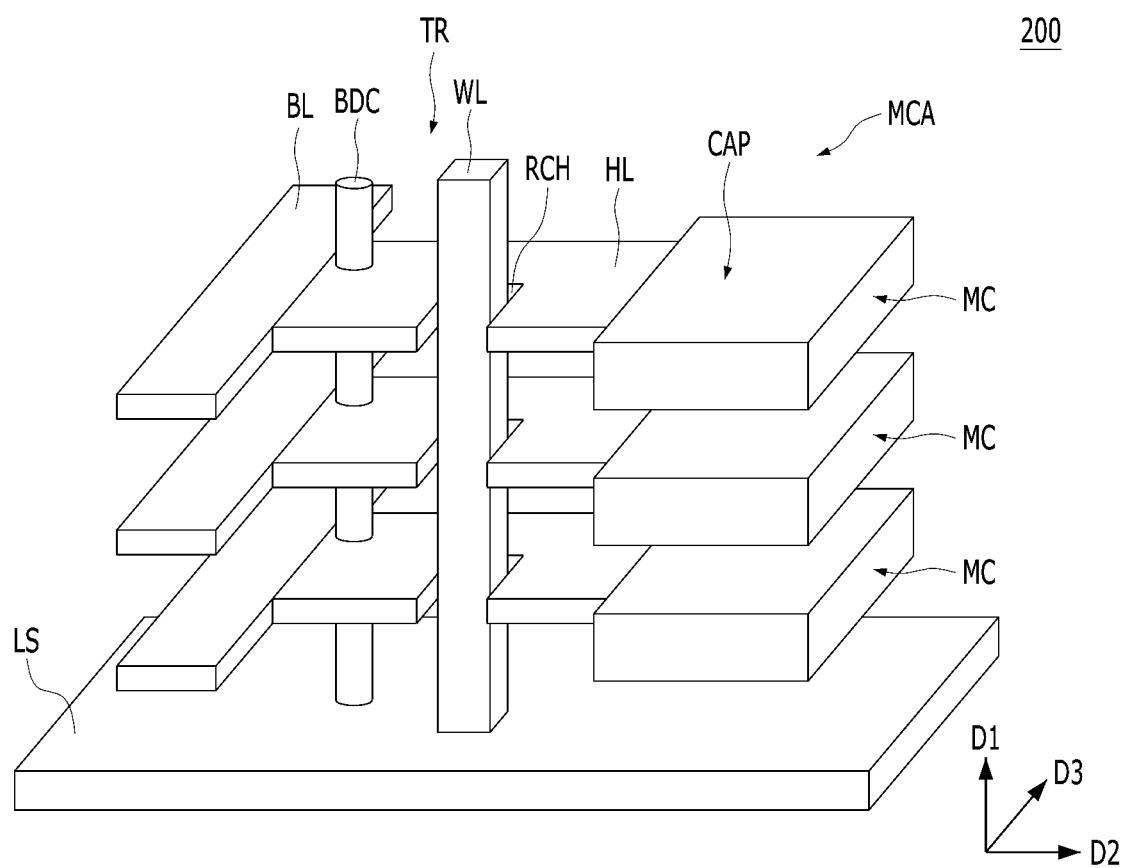
FIG. 5A is a schematic perspective view illustrating a semiconductor device in accordance with another embodiment of the present invention.
Figure 5B:
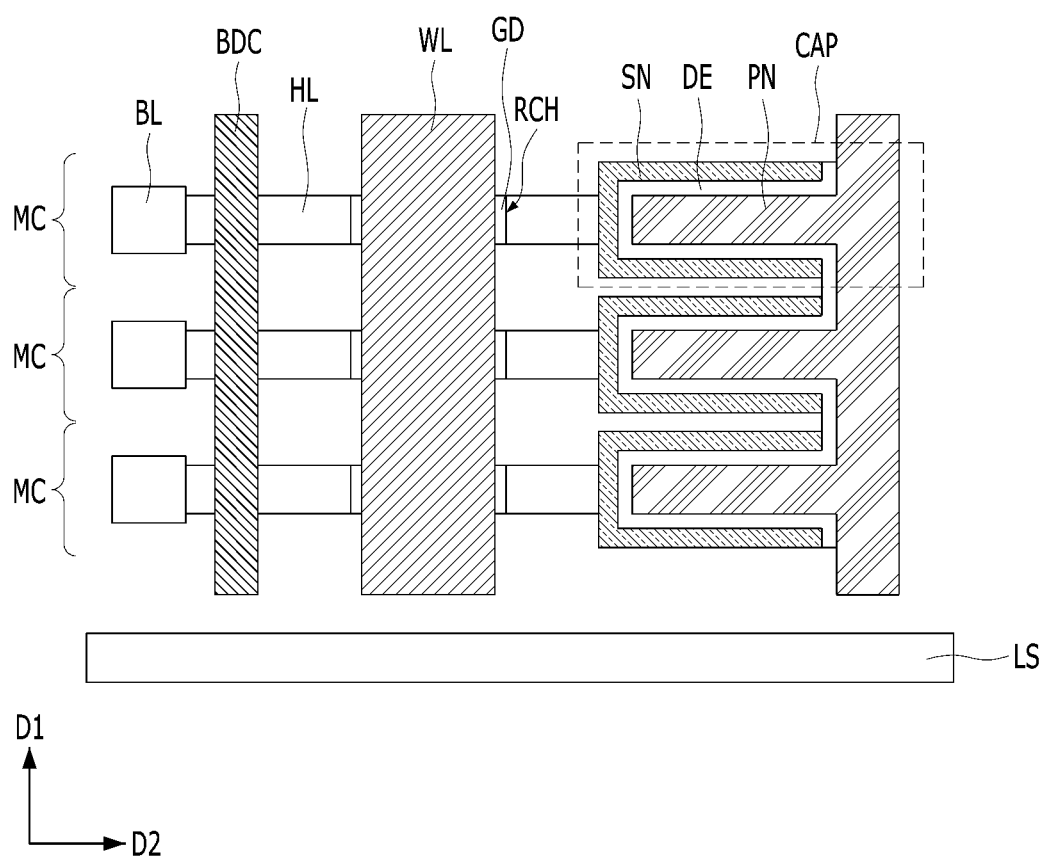
FIG. 5B is a schematic cross-sectional view illustrating the semiconductor device shown in FIG. 5A.

FIG. 5A is a schematic perspective view illustrating a semiconductor device in accordance with another embodiment of the present invention. FIG. 5B is a schematic cross-sectional view illustrating the semiconductor device shown in FIG. 5A.

Referring to FIGS. 5A and 5B, the semiconductor device 200 may include a lower structure LS and a memory cell array MCA which is disposed over the lower structure LS. The memory cell array MCA may include horizontal conductive lines BL that are stacked in the first direction D1 perpendicularly to the lower structure LS. The horizontal conductive lines BL are horizontally oriented in the third direction D3. The memory cell array MCA may also include data storage elements CAP are disposed over the lower structure LS to be spaced apart from the horizontal conductive lines BL, vertical conductive lines WL vertically oriented in the first direction D1 between the horizontal conductive lines BL and the data storage elements CAP, horizontal layers HL including a recessed side RCH disposed adjacent to the vertical conductive lines WL while being horizontally oriented in the second direction D2 between the horizontal conductive lines BL and the data storage elements CAP, and a body contact portion BDC vertically oriented in the first direction D1 by penetrating the horizontal layers HL.

The memory cell array MCA may include a three-dimensional array of memory cells MC. The three-dimensional array of the memory cells MC may include a column array of memory cells MC. Each of the memory cells MC may be the same as the memory cell MC shown in FIG. 1. Each of the memory cells MC may include a switching element TR and a data storage element CAP. The switching element TR may include a horizontal layer HL including a recessed side RCH and a vertical conductive line WL disposed adjacent to the recessed side RCH. A first end of the horizontal layer HL may be coupled to the vertical conductive line BL, and a second end of the horizontal layer HL may be coupled to the data storage element CAP.

The memory cells MC of the memory cell array MCA may share one body contact portion BDC. The body contact portion BDC may be coupled to the horizontal layers HL. The body contact portion BDC of the memory cell array MCA may be referred to as a common body contact portion.

The memory cells MC of the memory cell array MCA may share one vertical conductive line WL. The vertical conductive line WL may be vertically oriented to penetrate the recessed sides RCH of the horizontal layers HL. The vertical conductive line WL of the memory cell array MCA may be referred to as a common vertical conductive line.

The horizontal conductive lines BL of the memory cell array MCA may be electrically connected to the horizontal layers HL, respectively. The data storage elements CAP of the memory cell array MCA may be electrically connected to the horizontal layer HL, respectively. The memory cells MC stacked in the first direction D1 may share one vertical conductive line WL and one body contact portion BDC.

The memory cell array MCA may include a Dynamic Random Access Memory (DRAM) cell array.

Figure 6:
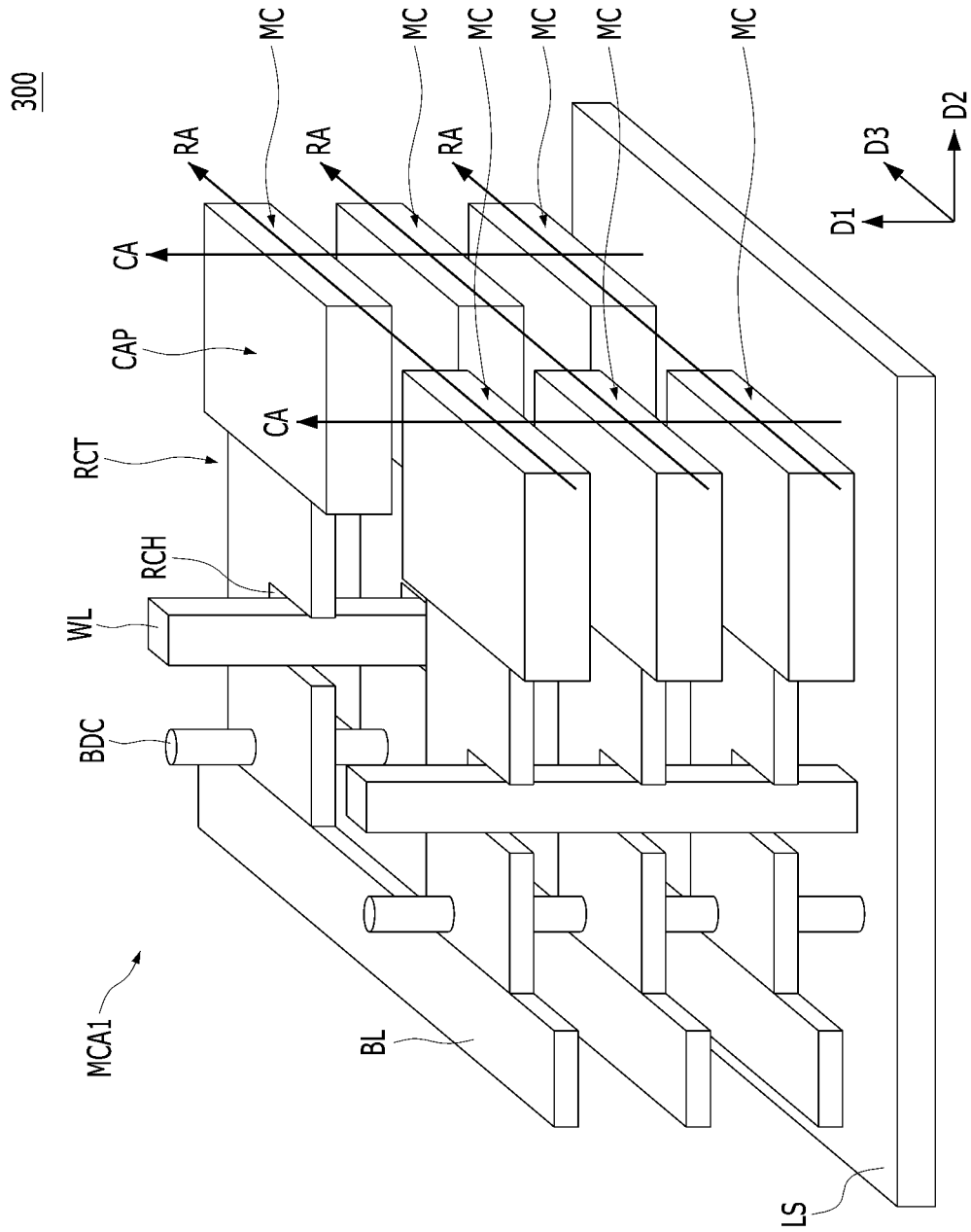
FIG. 6 is a schematic perspective view illustrating a semiconductor device in accordance with another embodiment of the present invention.

FIG. 6 is a schematic perspective view illustrating a semiconductor device in accordance with another embodiment of the present invention.

Referring to FIG. 6, the semiconductor device 300 may include a lower structure LS, and a memory cell array MCA1 disposed over the lower structure LS. The memory cell array MCA1 may include column arrays CA and row arrays RA. The column arrays CA may include a column array of memory cells MC, and the row arrays RA may include a row array of memory cells MC. The column arrays CA may include a column array of recessed channel transistors RCT, and the row arrays RA may include a row array of recessed channel transistors RCT. The column arrays CA may include a column array of data storage elements CAP, and the row arrays RA may include a row array of data storage elements CAP.

A vertical body contact portion BDC coupled in common to the recessed channel transistors RCT of the individual column arrays CA of the memory cell array MCA1 may be included. The recessed channel transistors RCT of the individual column arrays CA of the memory cell array MCA1 may include a recessed channel RCH and a common vertical gate line WL.

Figure 7:
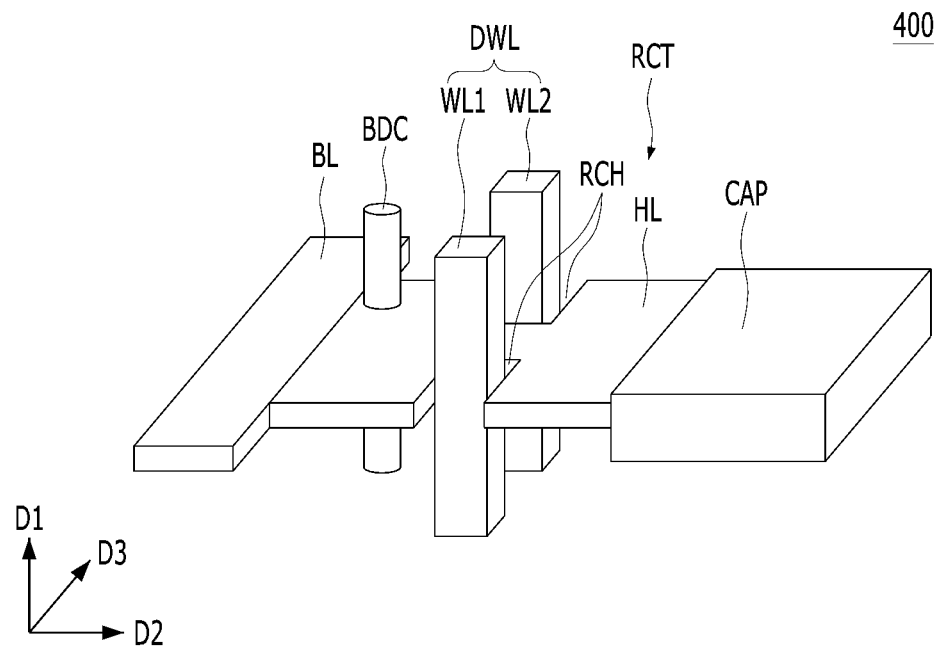
FIG. 7 is a schematic perspective view illustrating a semiconductor device in accordance with another embodiment of the present invention.
Figure 8:
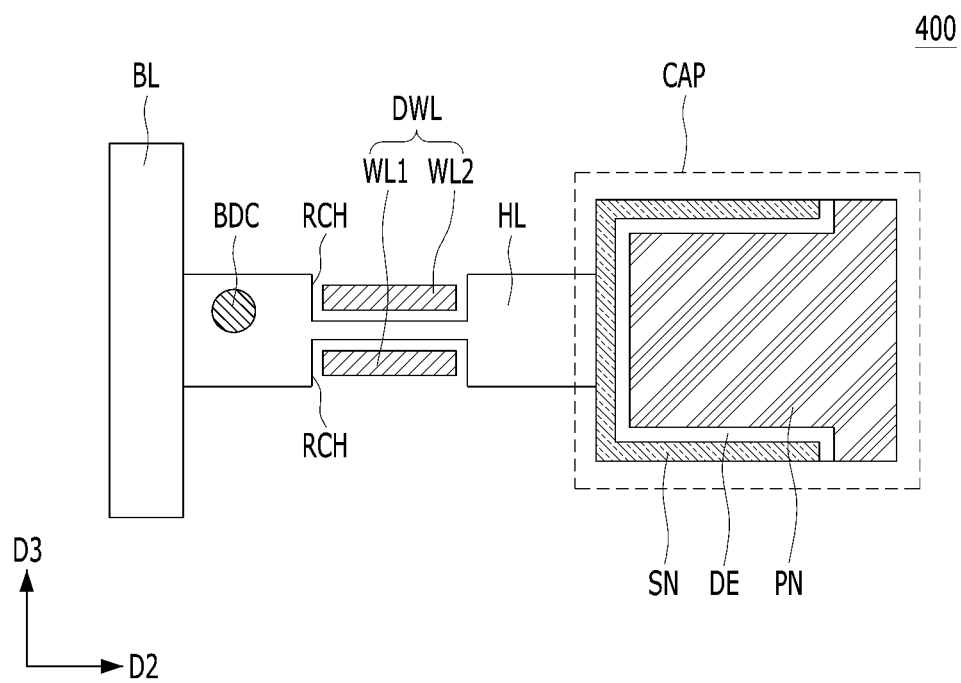
FIG. 8 is a schematic plan view illustrating the semiconductor device shown in FIG. 7.

FIG. 7 is a schematic perspective view illustrating a semiconductor device in accordance with another embodiment of the present invention. FIG. 8 is a schematic plan view illustrating the semiconductor device shown in FIG. 7.

Referring to FIGS. 7 and 8, the semiconductor device 400 may include a lower structure LS, a horizontal conductive line BL horizontally oriented over the lower structure LS, a data storage element CAP disposed over the lower structure LS to be spaced apart from the horizontal conductive line BL, a double vertical conductive line DWL oriented vertically between the horizontal conductive line BL and the data storage element CAP, a horizontal layer HL horizontally oriented between the horizontal conductive line BL and the data storage element CAP and including a double recessed side RCH disposed adjacent to the double vertical conductive line DWL, and a body contact portion BDC vertically oriented to penetrate the horizontal layer HL. The data storage element CAP may include a first electrode SN, a dielectric layer DE, and a second electrode PN, and the first electrode SN may have a cylindrical shape. The body contact portion BDC may extend in the first direction D1 while penetrating a portion of the horizontal layer HL. The body contact portion BDC and the horizontal layer HL may be electrically connected to each other.

The semiconductor device 100 shown in FIG. 1 and the semiconductor device 400 shown in FIGS. 7 and 8 may have the same constituent elements other than the vertical conductive line and the number of recessed sides. Whereas the semiconductor device 100 shown in FIG. 1 includes a single vertical conductive line WL, the semiconductor device 400 shown in FIGS. 7 and 8 may include a double vertical conductive line DWL. Whereas the semiconductor device 100 shown in FIG. 1 includes one recessed side RCH, the semiconductor device 400 shown in FIGS. 7 and 8 may include two recessed sides RCH. The double vertical conductive line DWL may include a first vertical conductive line WL1 and a second vertical conductive line WL2.

Figure 9A:
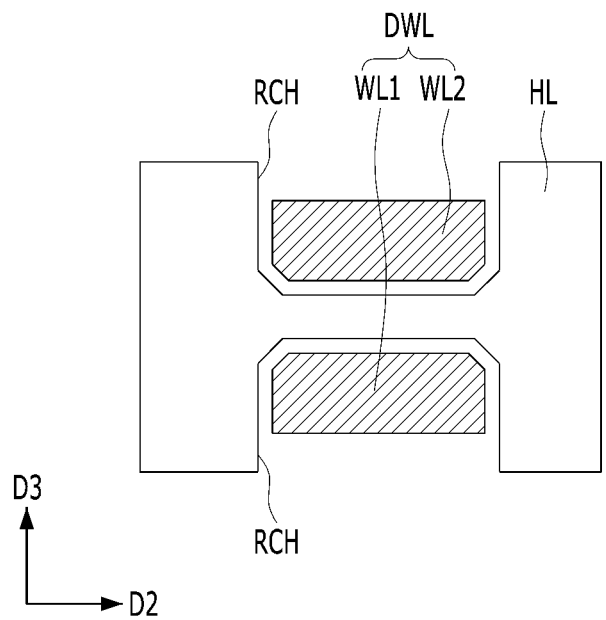
FIGS. 9A to 9F are plan views illustrating diverse modifications of a double vertical conductive line.
Figure 9B:
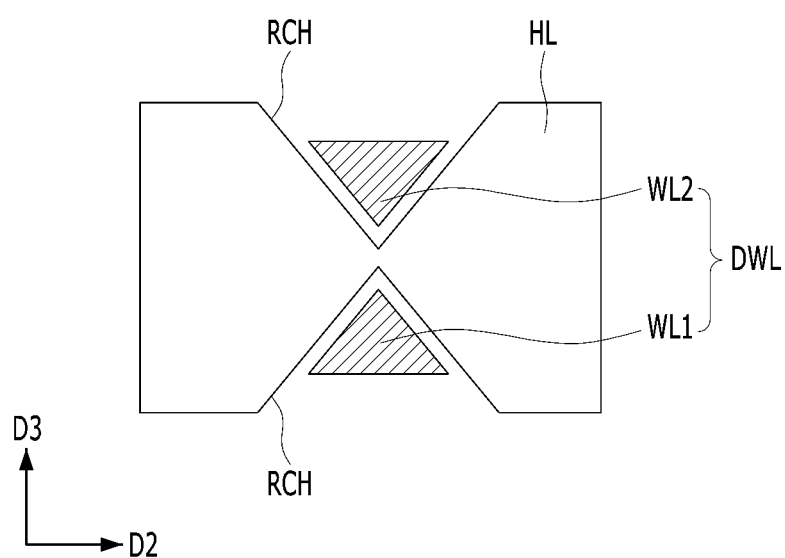
Figure 9C:
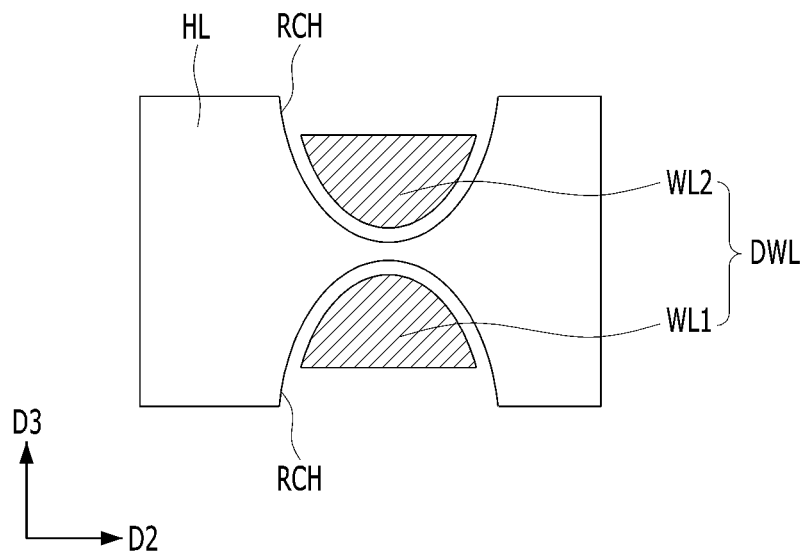
Figure 9D:
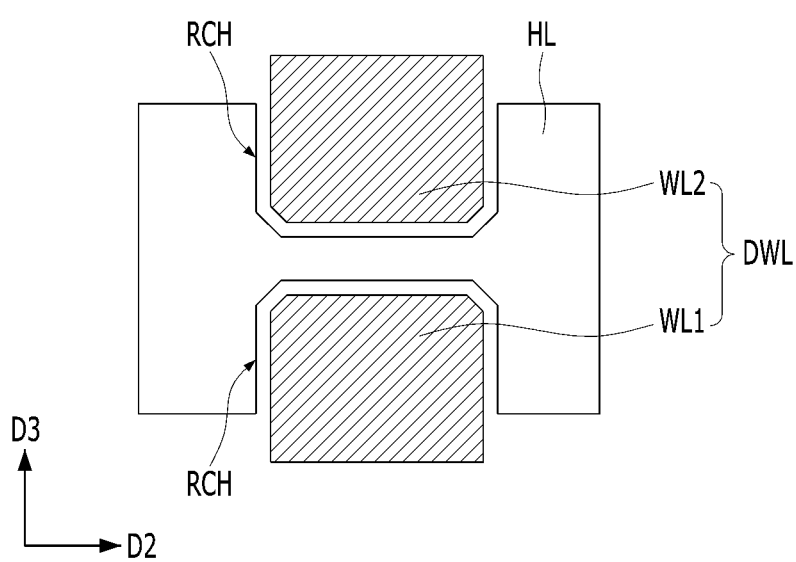
Figure 9E:
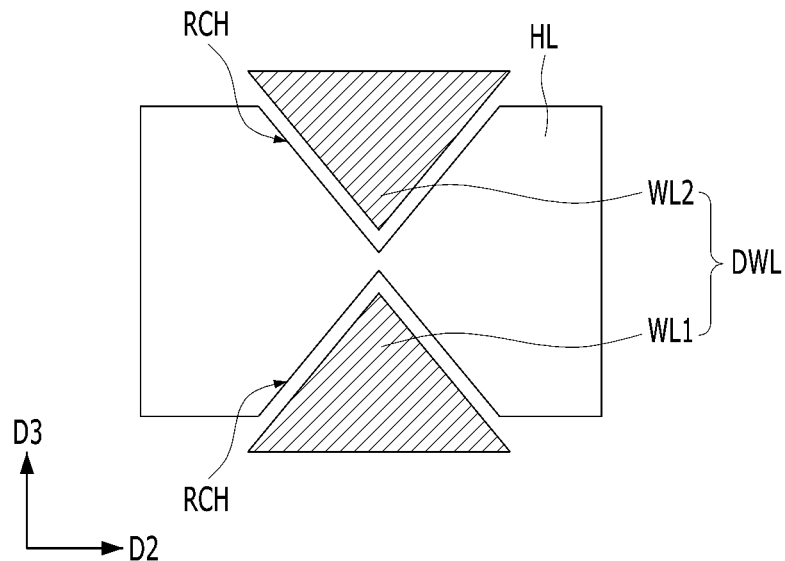
Figure 9F:
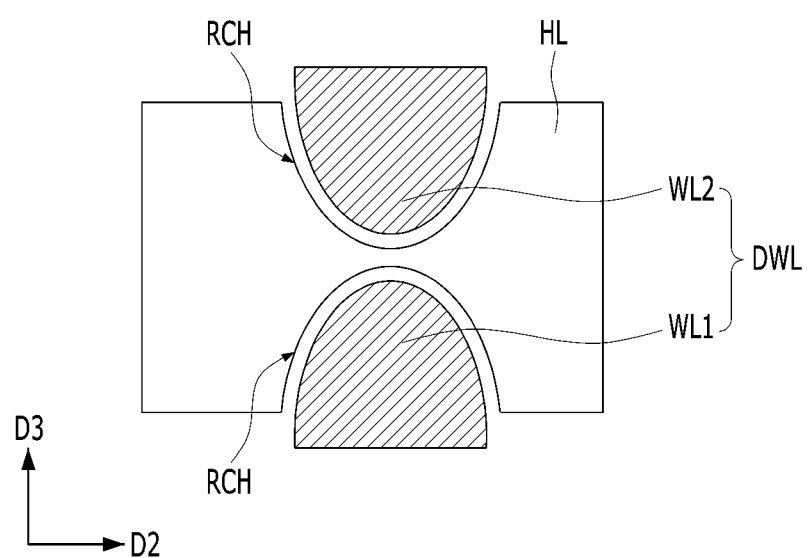

FIGS. 9A to 9F are plan views illustrating diverse modifications of a double vertical conductive line. Referring to FIGS. 9A to 9F, from a top view perspective, the first and second vertical conductive lines WL1 and WL2 of the double vertical conductive line DWL may have a shape disposed in each of two recessed sides RCH of the horizontal layer HL. According to another embodiment of the present invention, as illustrated in FIGS. 9D to 9F, a portion of the first and second vertical conductive lines WL1 and WL2 of the double vertical conductive line DWL may be disposed in the recessed sides RCH of the horizontal layer HL, and the other portion of the first and second vertical conductive lines WL1 and WL2 of the double vertical conductive line DWL may be disposed in the outside of the recessed sides RCH.

Referring to FIGS. 9A to 9F, a cross-section of the double recessed side RCH may include a bent shape, an angled shape, or a round shape. The cross-sections of the first and second vertical conductive lines WL1 and WL2 may be triangular, polygonal, or hemispherical. In FIGS. 9A to 9F, an embedded shape, a partially protruding shape, or a fully protruding shape may be defined according to the size of the width of the double vertical conductive line DWL in the third direction D3.

Figure 10:
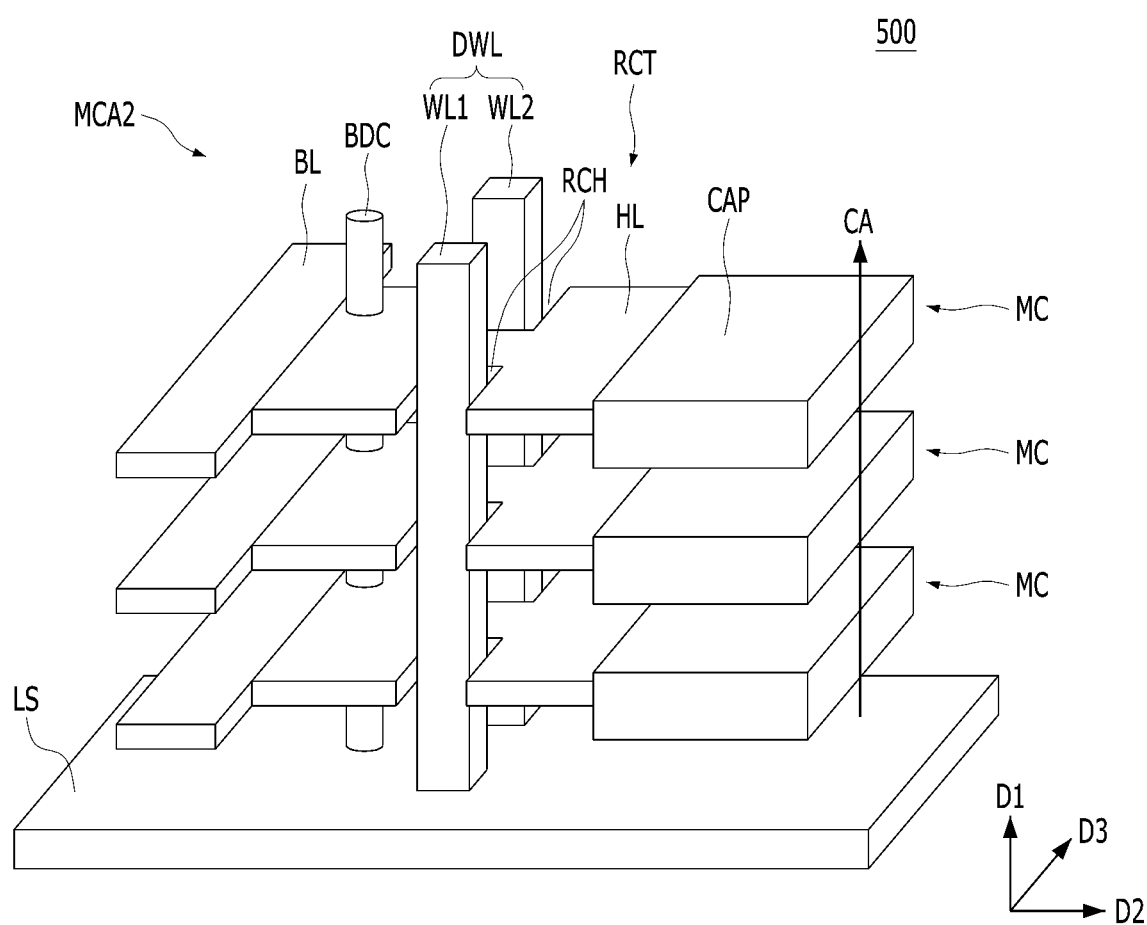
FIG. 10 is a schematic perspective view illustrating a semiconductor device in accordance with another embodiment of the present invention.

FIG. 10 is a schematic perspective view illustrating a semiconductor device in accordance with another embodiment of the present invention.

Referring to FIG. 10, the semiconductor device 500 may include a lower structure LS, and a memory cell array MCA2 disposed over the lower structure LS. The memory cell array MCA2 may include horizontal conductive lines BL that are stacked in the first direction D1 which is perpendicular to the lower structure LS and horizontally oriented in the third direction D3, data storage elements CAP disposed over the lower structure LS to be spaced apart from the horizontal conductive lines BL, double vertical conductive lines DWL oriented vertically in the first direction D1 between the horizontal conductive lines BL and the data storage elements CAP, horizontal layers HL horizontally oriented in the second direction D2 between the horizontal conductive lines BL and the data storage elements CAP and including a double recessed side RCH disposed adjacent to the double vertical conductive lines DWL, and a body contact portion BDC vertically oriented in the first direction D1 to penetrate the horizontal layers HL. The double vertical conductive lines DWL may include a first vertical conductive line WL1 and a second vertical conductive line WL2.

The memory cell array MCA2 may include a three-dimensional array of memory cells MC. The three-dimensional array of memory cells MC may include a column array of memory cells MC. Each of the memory cells MC may include a recessed channel transistor RCT and a data storage element CAP. The recessed channel transistor RCT may include a horizontal layer HL including a double recessed side RCH and a double vertical conductive line DWL disposed adjacent to the double recessed side RCH. A first end of the horizontal layer HL may be coupled to the vertical conductive line BL, and a second end of the horizontal layer HL opposite to the first end may be coupled to the data storage element CAP.

The memory cells MC of the memory cell array MCA2 may share one body contact portion BDC. The body contact portion BDC may be coupled to the horizontal layers HL. The body contact portion BDC of the memory cell array MCA2 may be referred to as a common body contact portion.

The memory cells MC of the memory cell array MCA2 may share one double vertical conductive line WL. The double vertical conductive line WL may be vertically oriented to penetrate the recessed sides RCH of the horizontal layers HL. The double vertical conductive line DWL of the memory cell array MCA2 may be referred to as a common vertical conductive line.

The horizontal conductive lines BL of the memory cell array MCA2 are electrically connected to the horizontal layers HL, respectively. The data storage elements CAP of the memory cell array MCA2 may be electrically connected to the horizontal layers HL, respectively. Each of the memory cells MC that are stacked in the first direction D1 may share one double vertical conductive line DWL and one body contact portion BDC.

Figure 11:
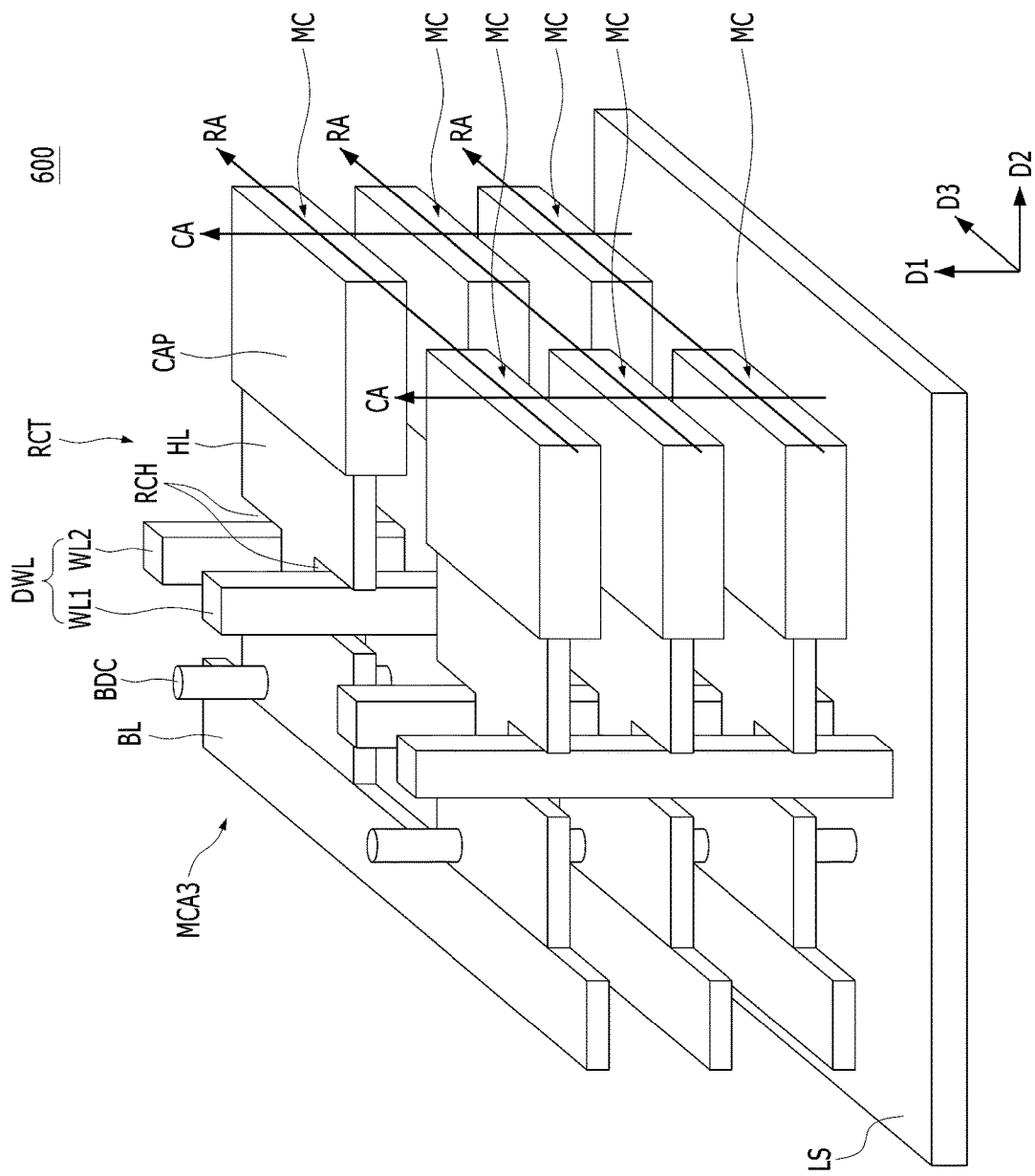
FIG. 11 is a schematic perspective view illustrating a semiconductor device in accordance with another embodiment of the present invention.

FIG. 11 is a schematic perspective view illustrating a semiconductor device in accordance with another embodiment of the present invention.

Referring to FIG. 11, the semiconductor device 600 may include a lower structure LS and a memory cell array MCA3 disposed over the lower structure LS. The memory cell array MCA3 may include column arrays CA and row arrays RA. The column arrays CA may include a column array of memory cells MC, and the row arrays RA may include a row array of memory cells MC. The column arrays CA may include a column array of recessed channel transistors RCT, and the row arrays RA may include a row array of recessed channel transistors RCT. The column arrays CA may include a column array of data storage elements CAP, and the row arrays RA may include a row array of data storage elements CAP.

A vertical body contact portion BDC coupled in common to the recessed channel transistors RCT of the individual column arrays CA of the memory cell array MCA1 may be included. The recessed channel transistors RCT of the individual column arrays CA of the memory cell array MCA1 may include a recessed channel RCH and a common vertical conductive line WL.

Figure 12:
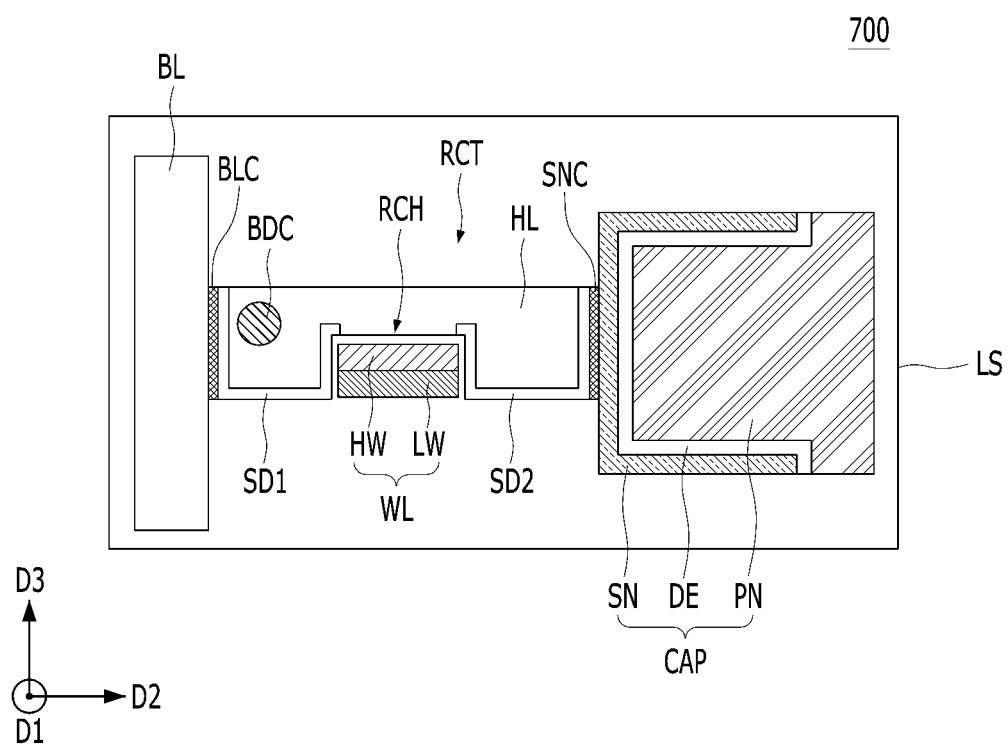
FIG. 12 is a schematic plan view illustrating a semiconductor device in accordance with another embodiment of the present invention.

FIG. 12 is a schematic plan view illustrating a semiconductor device in accordance with another embodiment of the present invention.

Referring to FIG. 12, the semiconductor device 700 may include a lower structure LS, a horizontal conductive line BL horizontally oriented over the lower structure LS, a data storage element CAP disposed over the lower structure LS to be spaced apart from the horizontal conductive line BL, a vertical conductive line WL oriented vertically between the horizontal conductive line BL and the data storage element CAP, a horizontal layer HL horizontally oriented between the horizontal conductive line BL and the data storage element CAP and including a recessed side RCH disposed adjacent to the vertical conductive line WL, and a body contact portion BDC vertically oriented by penetrating the horizontal layer HL.

The vertical conductive line WL may be vertically oriented in the first direction D1. The horizontal layer HL may be horizontally oriented in the second direction D2. The horizontal conductive line BL may be horizontally oriented in the third direction D3. The horizontal layer HL may be horizontally oriented in the second direction D2 between the horizontal conductive line BL and the data storage element CAP. The horizontal conductive line BL may be coupled to a first end of the horizontal layer HL, and the data storage element CAP may be coupled to a second end opposite to the first end of the horizontal layer HL. The horizontal layer HL may include one recessed side RCH. The horizontal layer HL and the vertical conductive line WL may form a switching element, such as a Recessed Channel Transistor RCT.

A first contact node BLC may be formed between the first end of the horizontal layer HL and the horizontal conductive line BL, and a second contact node SNC may be formed between the second end of the horizontal layer HL and the data storage element CAP. The first and second contact nodes BLC and SNC may include a conductive material, for example, doped polysilicon. The doped polysilicon may include, for example, polysilicon which is doped with an N-type impurity. A first doped region SD1 may be formed between the recessed side RCH and the first contact node BLC, and a second doped region SD2 may be formed between the recessed side RCH and the second contact node SNC. The first doped region SD1 and the second doped region SD2 may be formed in the horizontal layer HL. The first doped region SD1 and the second doped region SD2 may include impurities that are diffused from the first and second contact nodes BLC and SNC, respectively.

The vertical conductive line WL may include a high work function electrode HW and a low work function electrode LW. The low work function electrode LW may include doped polysilicon, and the high work function electrode HW may include a metal-based material. The high work function electrode HW may be disposed adjacent to the recessed side RCH. The low work function electrode LW may horizontally overlap with the first and second doped regions SD1 and SD2, thereby suppressing the Gate-Induced Drain Leakage GIDL.

Figure 13:
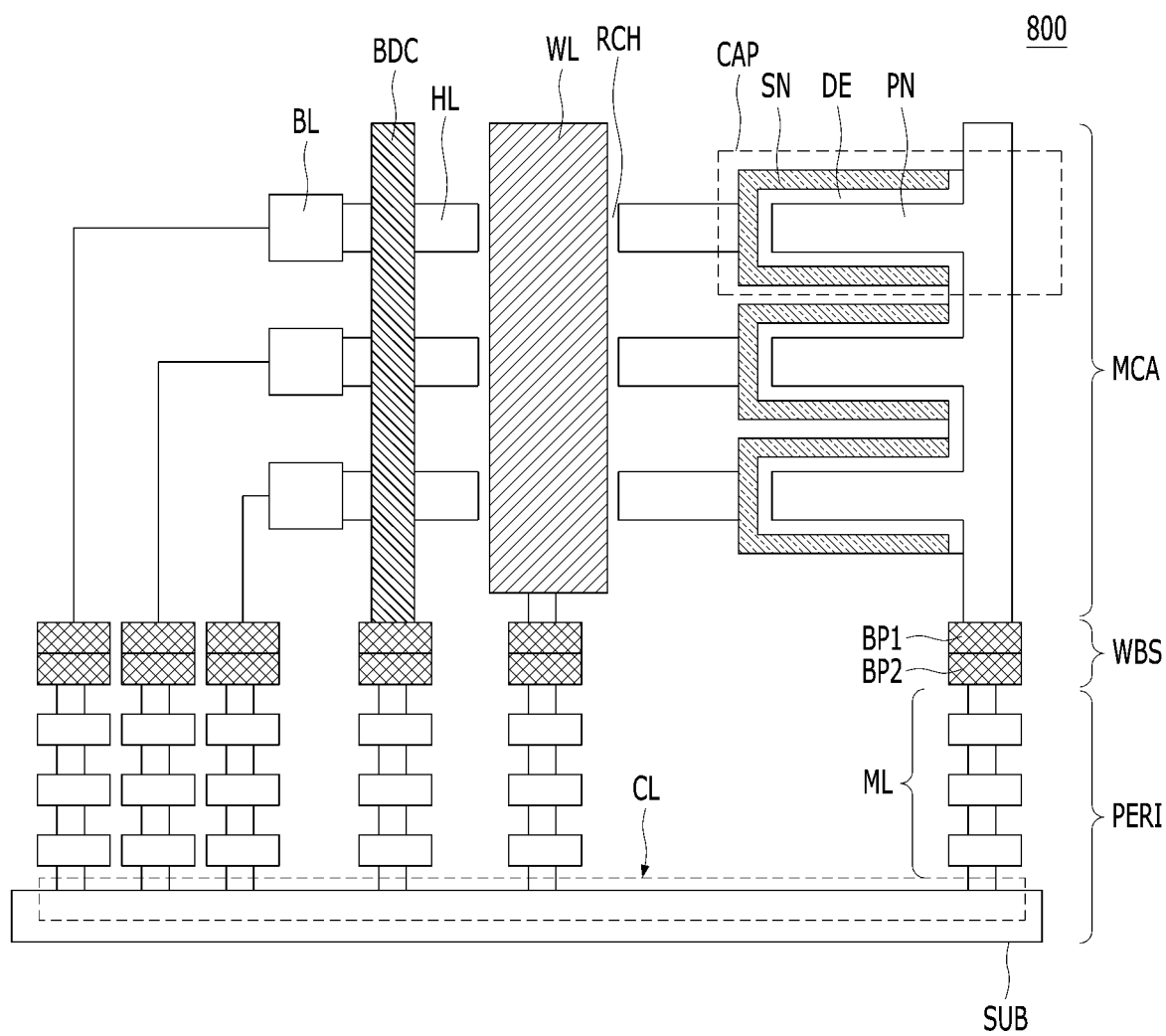
FIGS. 13 and 14 are schematic cross-sectional views illustrating a semiconductor device in accordance with another embodiment of the present invention.
Figure 14:
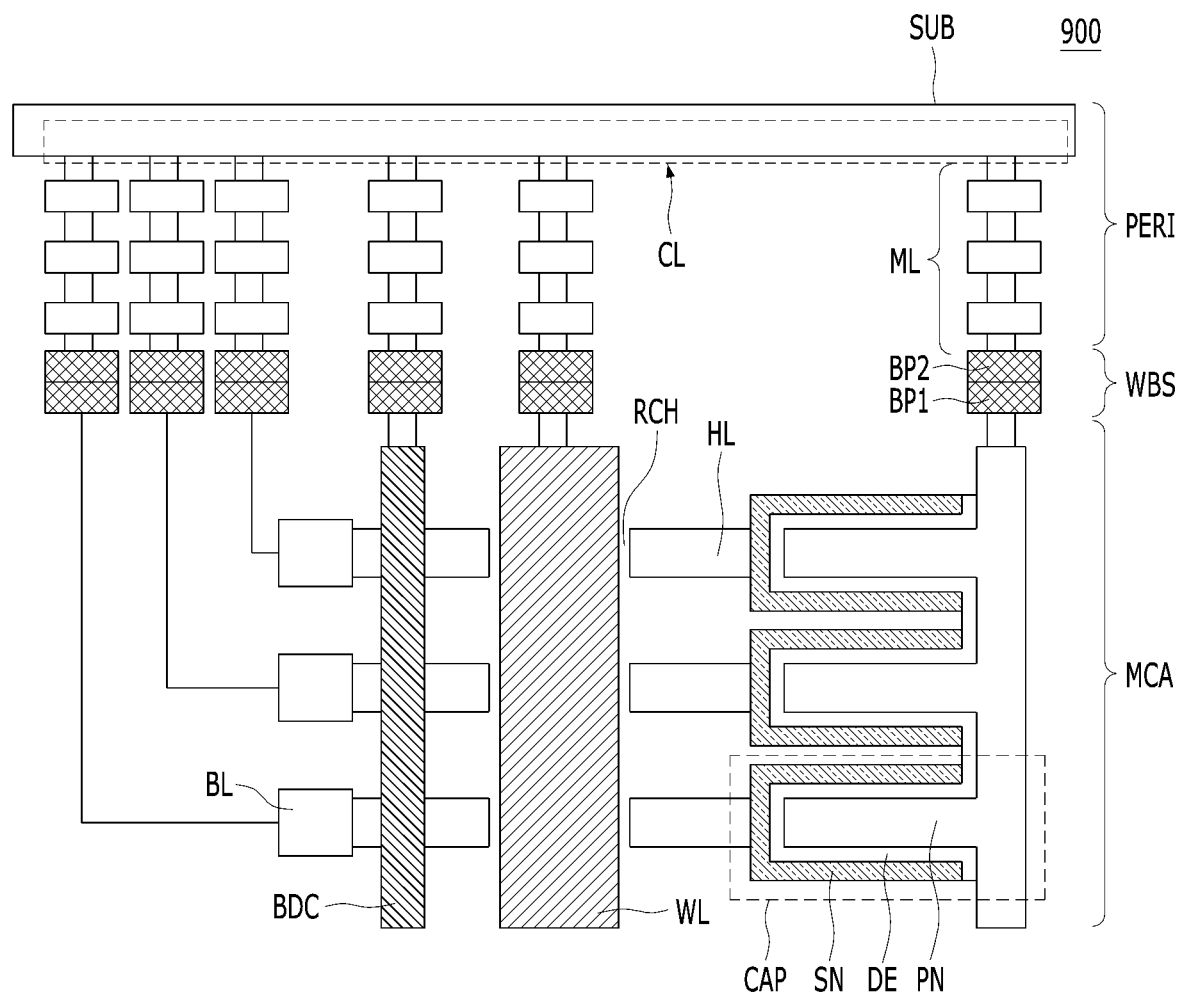

FIGS. 13 and 14 are schematic cross-sectional views illustrating a semiconductor device in accordance with another embodiment of the present invention.

Referring to FIGS. 13 and 14, the semiconductor device 800 may include a peripheral circuit portion PERI and a memory cell array MCA. The memory cell array MCA may be disposed over the peripheral circuit portion PERI. The memory cell array MCA and the peripheral circuit portion PERI may be combined by wafer bonding. The semiconductor device 800 may have a COP (Cell-Over-Peripheral) structure.

The memory cell array MCA may include a plurality of memory cells. The memory cell array MCA may include a plurality of horizontal conductive lines BL, a plurality of vertical conductive lines WL, and a plurality of data storage elements CAP. Horizontal layers HL may be disposed between the horizontal conductive lines BL and the data storage elements CAP. The horizontal layers HL may include recessed sides RCH, and the vertical conductive lines WL may be disposed adjacent to the recessed sides RCH. Each of the data storage elements CAP may include a first electrode SN, a dielectric layer DE, and a second electrode PN. The second electrodes PN of the data storage elements CAP that are stacked vertically may be coupled to each other. The horizontal layers HL may share the body contact portion BDC.

A bonding structure WBS may be disposed between the peripheral circuit portion PERI and the memory cell array MCA. The bonding structure WBS may include first and second bonding pads BP1 and BP2. The memory cell array MCA and the peripheral circuit portion PERI may be coupled to each other through metal-to-metal bonding or hybrid bonding. For example, they may be coupled to each other through the first bonding pads BP1 and the second bonding pads BP2. Metal-to-metal bonding may refer to direct bonding between the first and second bonding pads BP1 and BP2, and hybrid bonding may refer to a combination of metal-to-metal bonding and dielectric bonding. The first and second bonding pads BP1 and BP2 may include a metal material.

The body contact portion BDC, the horizontal conductive line BL, and the vertical conductive line WL may be coupled to the first bonding pads BP1, respectively. The second electrodes PN of the data storage elements CAP may be coupled to each other to be coupled to the first bonding pads BP1.

The peripheral circuit portion PERI may include a substrate SUB, a plurality of control circuits CL, and a plurality of interconnections ML. For example, the control circuits CL of the peripheral circuit portion PERI may include a sense amplifier, a sub-word line driver, and the like. The sense amplifier may be coupled to the horizontal conductive lines BL through the interconnections ML. The sub-word line driver may be coupled to the vertical conductive lines WL through the interconnections ML.

Referring to FIG. 14, the semiconductor device 900 may have a POC (Peripheral-Over-Cell) structure. The POC structure may refer to a structure in which a peripheral circuit portion PERI is disposed over the memory cell array MCA. The peripheral circuit portion PERI may include a substrate SUB, a plurality of control circuits CL, and a plurality of interconnections ML. For example, the control circuits CL of the peripheral circuit portion PERI may include a sense amplifier, a sub-word line driver, and the like. The sense amplifier may be coupled to the horizontal conductive lines BL through the interconnections ML. The sub-word line driver may be coupled to the vertical conductive lines WL through the interconnections ML.

A bonding structure WBS may be disposed between the peripheral circuit portion PERI and the memory cell array MCA. The bonding structure WBS may include first and second bonding pads BP1 and BP2. The memory cell array MCA and the peripheral circuit portion PERI may be coupled to each other through metal-to-metal bonding or hybrid bonding. The body contact portion BDC, the horizontal conductive line BL, and the vertical conductive line WL may be coupled to the first bonding pads BP1, respectively.

Referring to FIGS. 1 to 14, since recessed channel transistors are formed according to the embodiments of the present invention, the channel length may be increased, which is advantageous in terms of the threshold voltage control. Also, since the distance between the doped regions and the recessed channel increases, a junction dopant slope may go smooth, thus improving junction leakage.

Also, since body contact portions are formed according to the embodiments of the present invention, it is possible to suppress a floating body effect.

FIGS. 15A to 27B illustrate an example of a method for fabricating a semiconductor device. FIGS. 15A to 27A are plan views illustrating an example of a method for fabricating a semiconductor device, and FIGS. 15B to 27B are cross-sectional views taken along a line A-A' shown in FIGS. 15A to 27A.

Figure 15A:
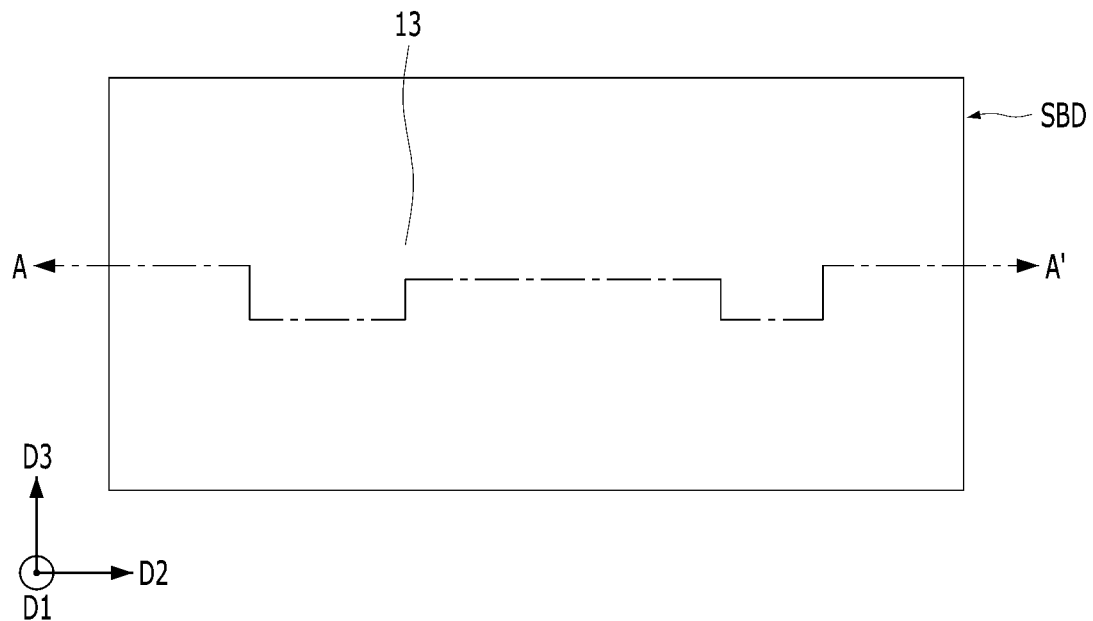
FIGS. 15A to 27B illustrate an example of a method for fabricating a semiconductor device.
Figure 15B:
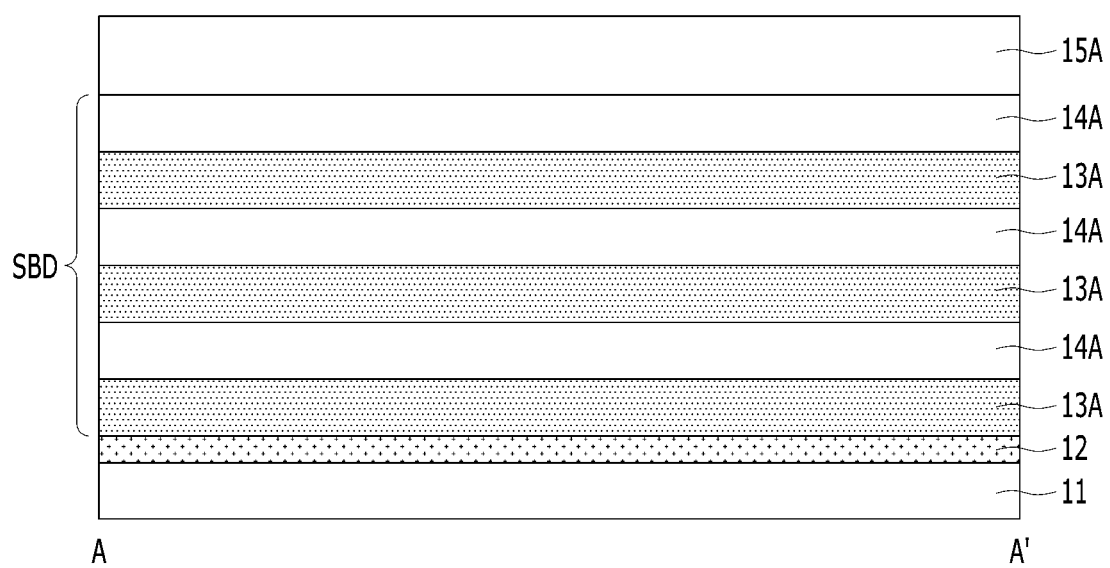

Referring to FIGS. 15A and 15B, an etch stopper layer 12 may be formed over the lower structure 11. The lower structure 11 may include a semiconductor substrate, and the etch stopper layer 12 may include silicon nitride.

A stack body SBD in which semiconductor material layers 13A and cell isolation material layers 14A are alternately stacked over the etch stopper layer 12 may be formed. The semiconductor material layers 13A may include a silicon layer, and the cell isolation material layers 14A may include, for example, silicon oxide. The semiconductor material layers 13A may include monocrystalline silicon or polysilicon. According to another embodiment of the present invention, the semiconductor material layers 13A may be replaced with oxide semiconductor materials, such as IGZO.

A hard mask layer 15A may be formed over the stack body SBD. The hard mask layer 15A may have an etch selectivity with respect to the stack body SBD. For example, the hard mask layer 15A may include silicon nitride.

Figure 16A:
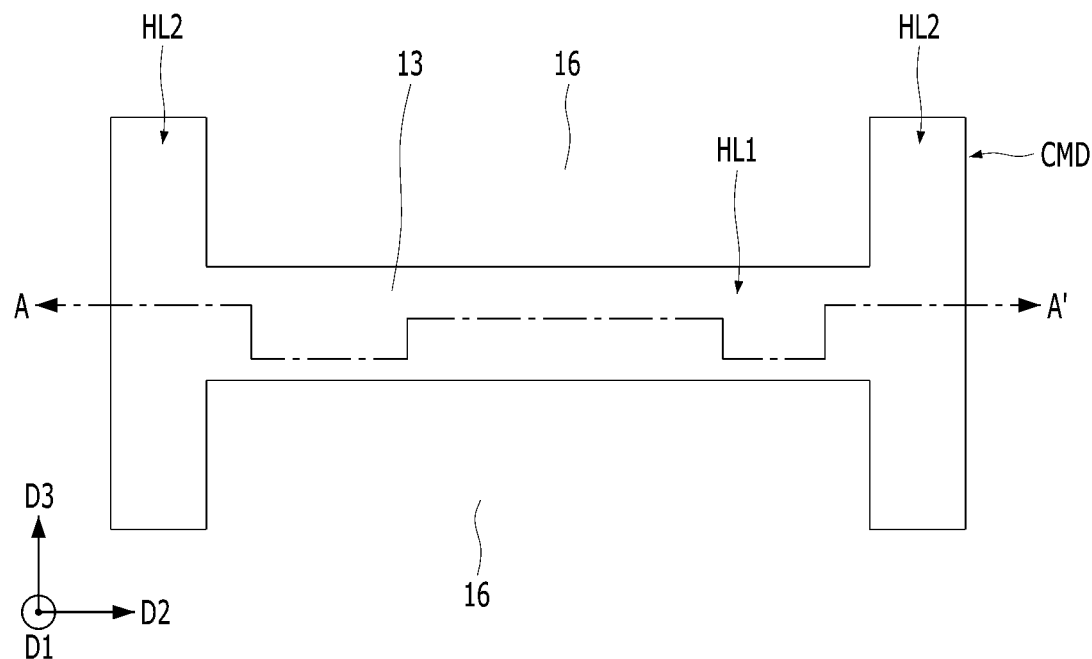
Figure 16B:
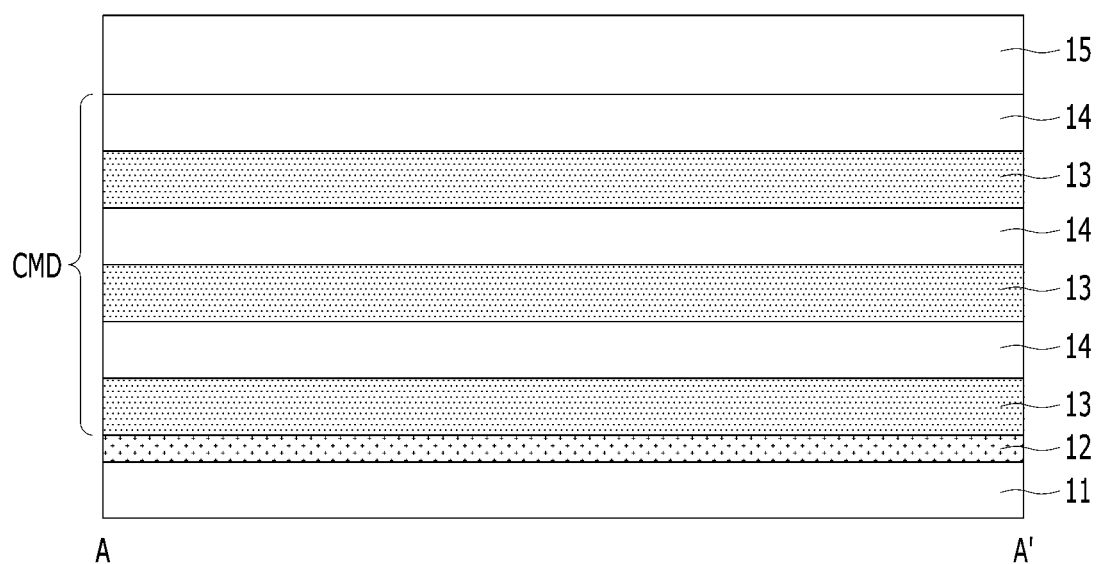

Referring to FIGS. 16A and 16B, an isolation trench 16 may be formed by etching the hard mask layer 15A and the stack body SBD. An etching process for forming the isolation trench 16 may stop at the etch stopper layer 12. A cell mold structure CMD may be defined by the isolation trench 16. In the cell mold structure CMD, semiconductor layers 13 and cell isolation layers 14 may be alternately stacked. The semiconductor layers 13 may be formed by etching the semiconductor material layers 13A, and the cell isolation layers 14 may be formed by etching the cell isolation material layers 14A. From a top view perspective, the cell mold structure CMD may include a plurality of first horizontal portions HL1 and a plurality of second horizontal portions HL2. The first horizontal portions HL1 may extend in the second direction D2, and the second horizontal portions HL2 may extend in the third direction D3. The second horizontal portions HL2 may be respectively disposed on both sides of the first horizontal portions HL1.

Figure 17A:
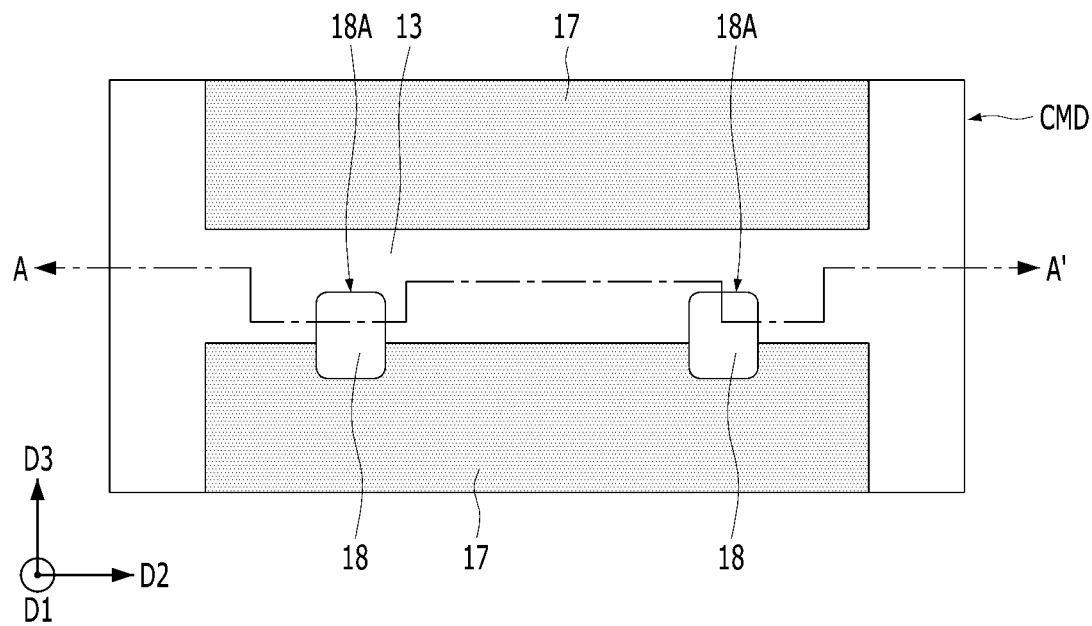
Figure 17B:
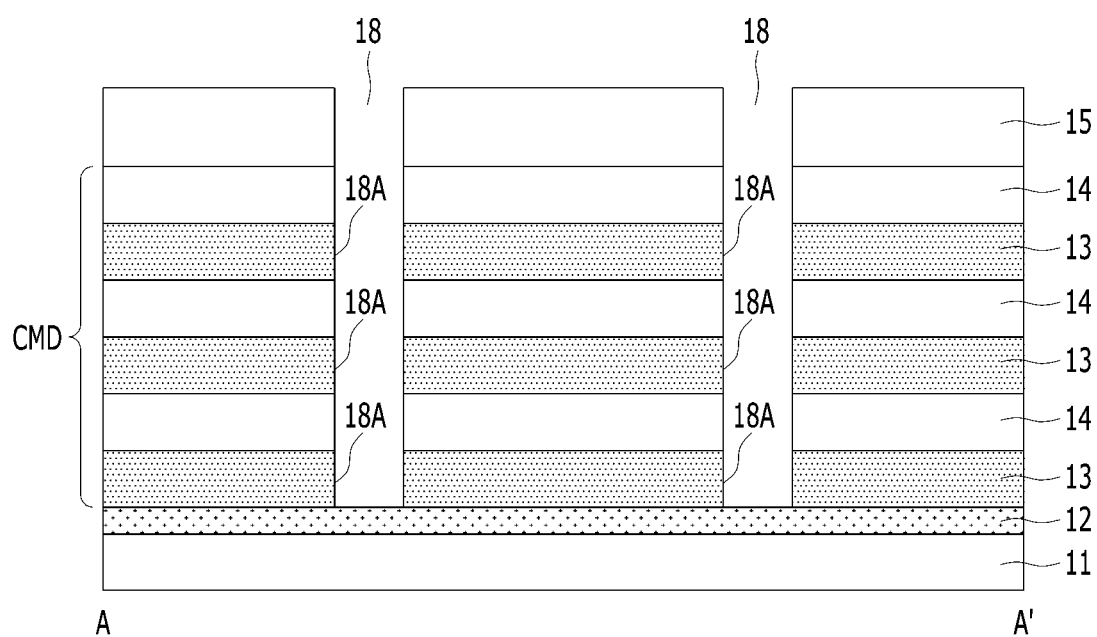

Referring to FIGS. 17A and 17B, an isolation layer 17 filling the isolation trench 16 may be formed. The isolation layer 17 may include, for example, silicon oxide, silicon nitride, or a combination thereof.

First vertical opening 18 may be formed by etching a portion of the isolation layer 17 and the first horizontal portions HL1 of the cell mold structure CMD. The first vertical openings 18 may be oriented perpendicularly from the surface of the etch stopper layer 12. The first verticals opening 18 may define recessed sides 18A in the first horizontal portions HL1 of the semiconductor layers 13.

Figure 18A:
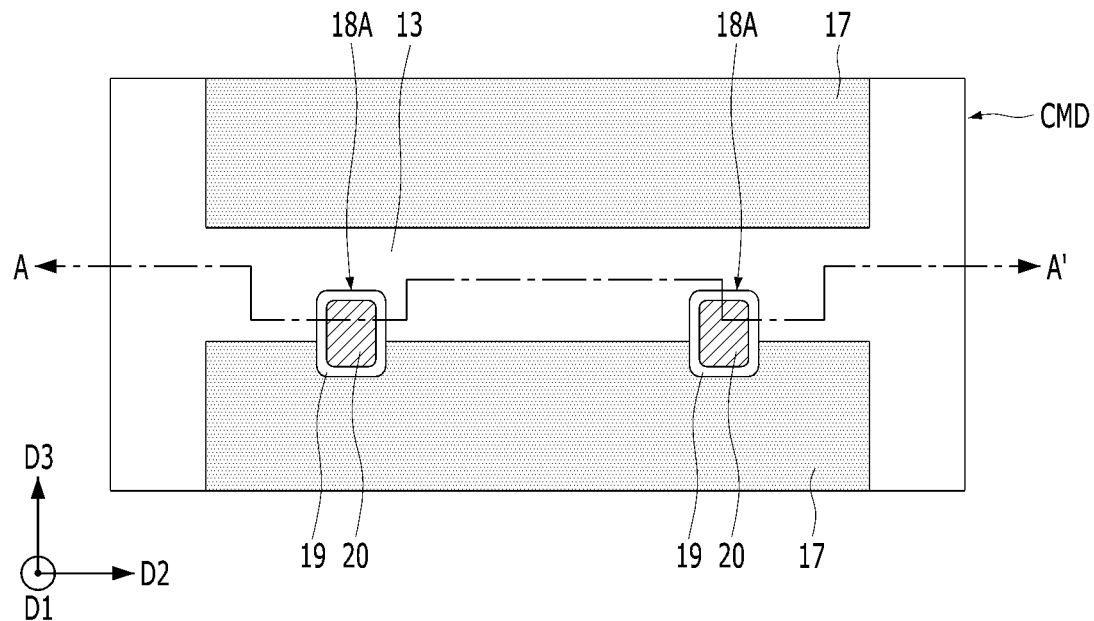
Figure 18B:
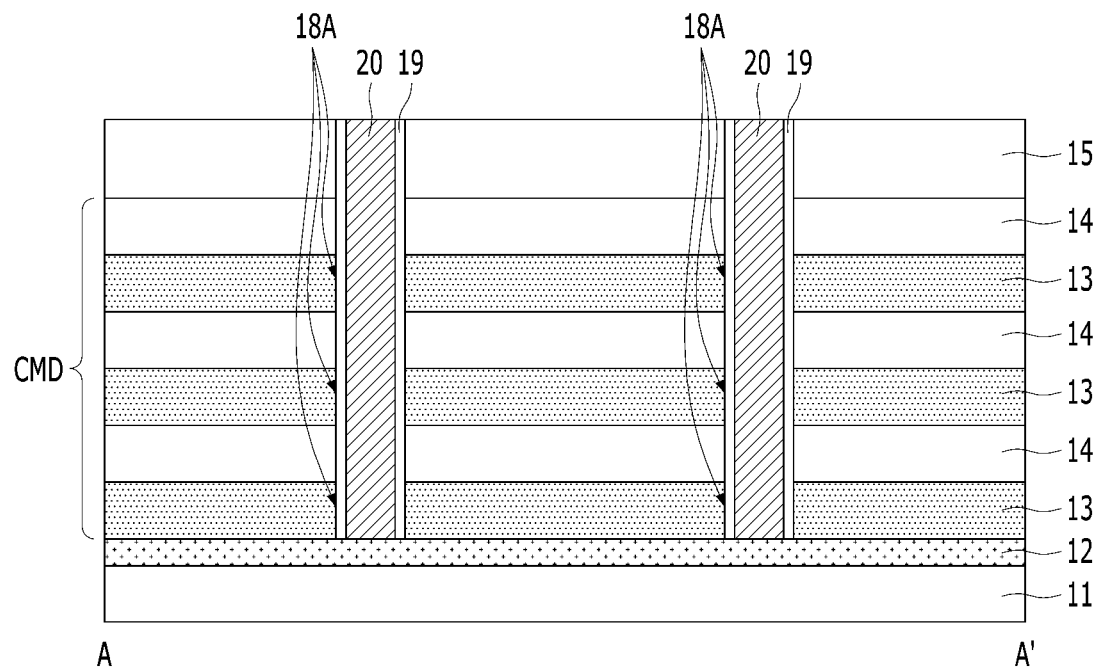

Referring to FIGS. 18A and 18B, vertical conductive lines 20 filling the first vertical openings 18 may be formed. The vertical conductive lines 20 may include a conductive material. The vertical conductive lines 20 may include, for example, polysilicon, a metal, a metal nitride, or a combination thereof. Prior to forming the vertical conductive lines 20, a dielectric layer 19 covering the sidewall of the first vertical openings 18 may be formed. The dielectric layer 19 may include, for example, silicon oxide, silicon nitride, a high-k material, or a combination thereof. The dielectric layer 19 may include a gate dielectric layer. When the vertical conductive lines 20 are gate lines or word lines, the recessed sides 18A may be recessed channels.

Figure 19A:
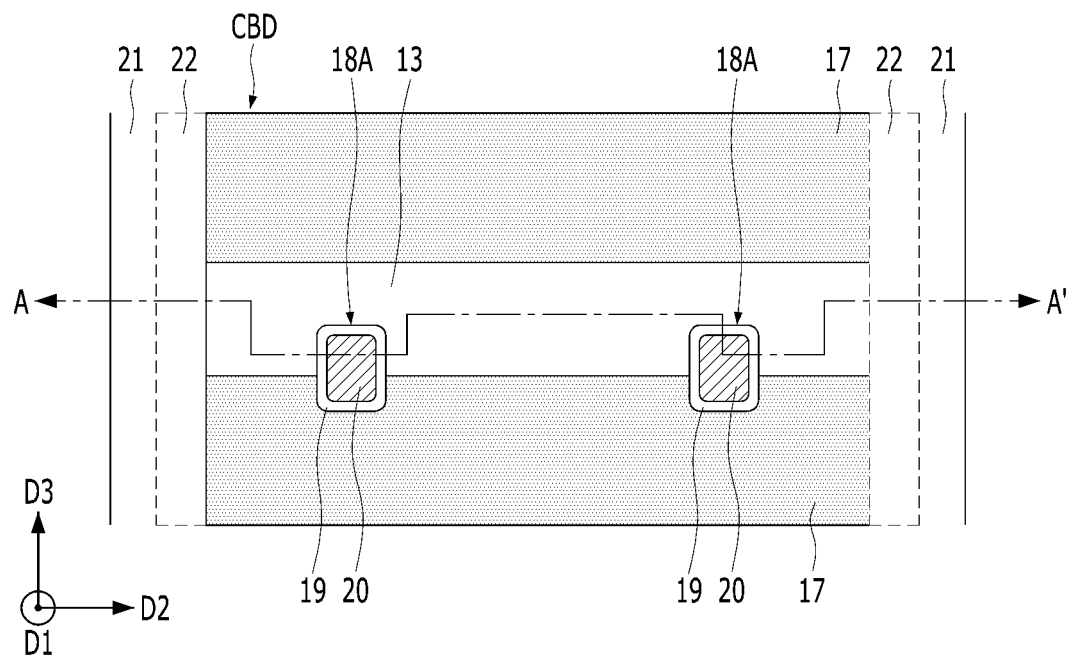
Figure 19B:
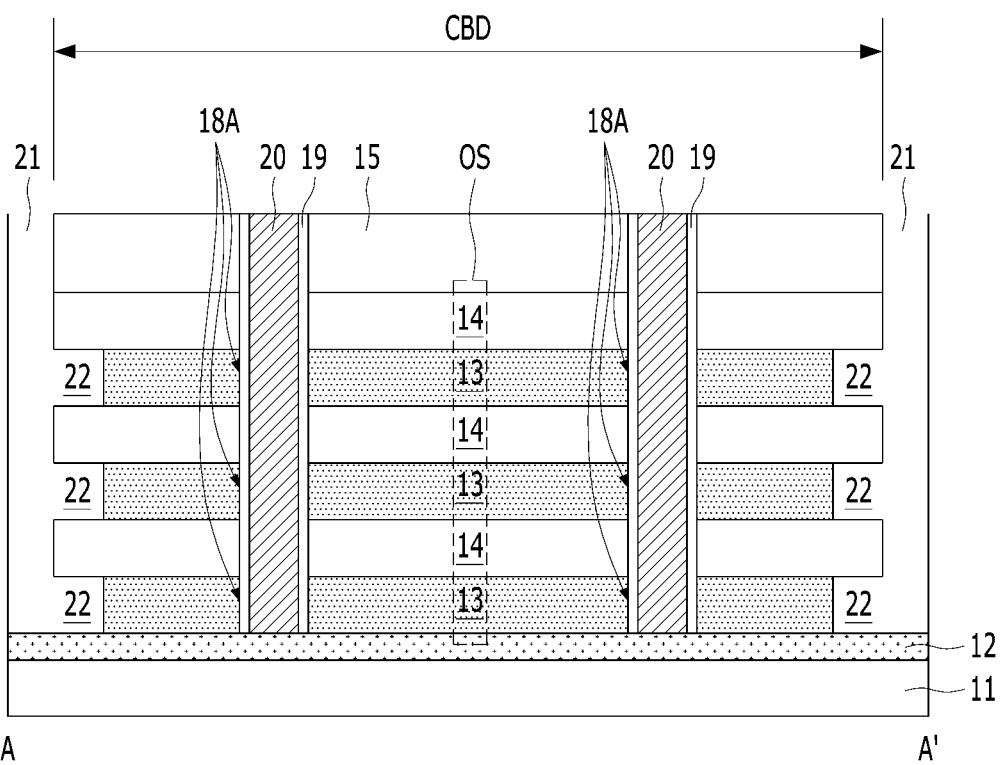

Referring to FIGS. 19A and 19B, first slits 21 for dividing a neighboring cell mold structure CMD into a plurality of cell stack bodies CBD may be formed. To form the first slits 21, the second horizontal portions HL2 of the cell mold structure CMD may be etched. The cell stack body CBD may include a cell mold stack OS, in which the semiconductor layers 13 and the cell isolation layers 14 may be alternately stacked. From a top view perspective, the cell stack body CBD may include a plurality of first horizontal portions HL1 and a plurality of second horizontal portions HL2. The first horizontal portions HL1 may extend in the second direction D2, and the second horizontal portions HL2 may extend in the third direction D3. The first slits 21 may extend in the third direction D3. The first slits 21 may have a trench shape.

Edges of the semiconductor layers 13 of the cell stack body CBD may be recessed through the first slits 21. Accordingly, a plurality of first horizontal recesses 22 may be formed between the cell isolation layers 14 of the second horizontal portions HL2. The edges of the semiconductor layers 13 may be selectively etched to form the first horizontal recesses 22.

Figure 20A:
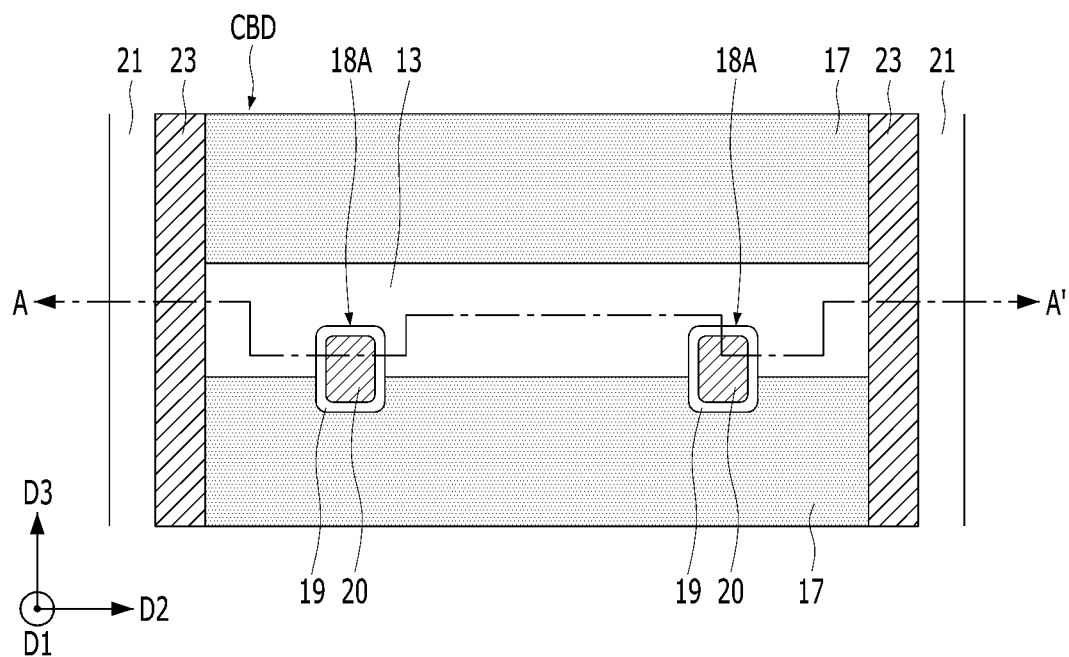
Figure 20B:
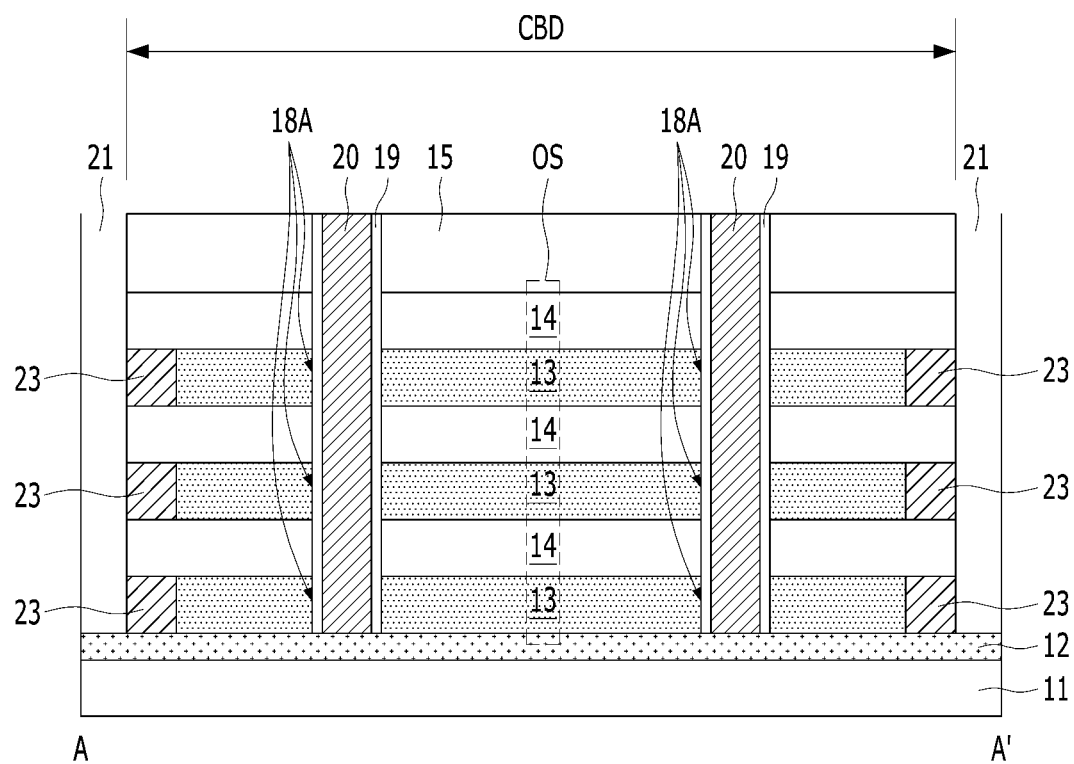

Referring to FIGS. 20A and 20B, horizontal conductive lines 23 filling the first horizontal recesses 22 may be formed. The horizontal conductive lines 23 may include a conductive material. The horizontal conductive lines 23 may include, for example, polysilicon, a metal, a metal nitride, or a combination thereof. The horizontal conductive lines 23 may include bit lines.

Figure 21A:
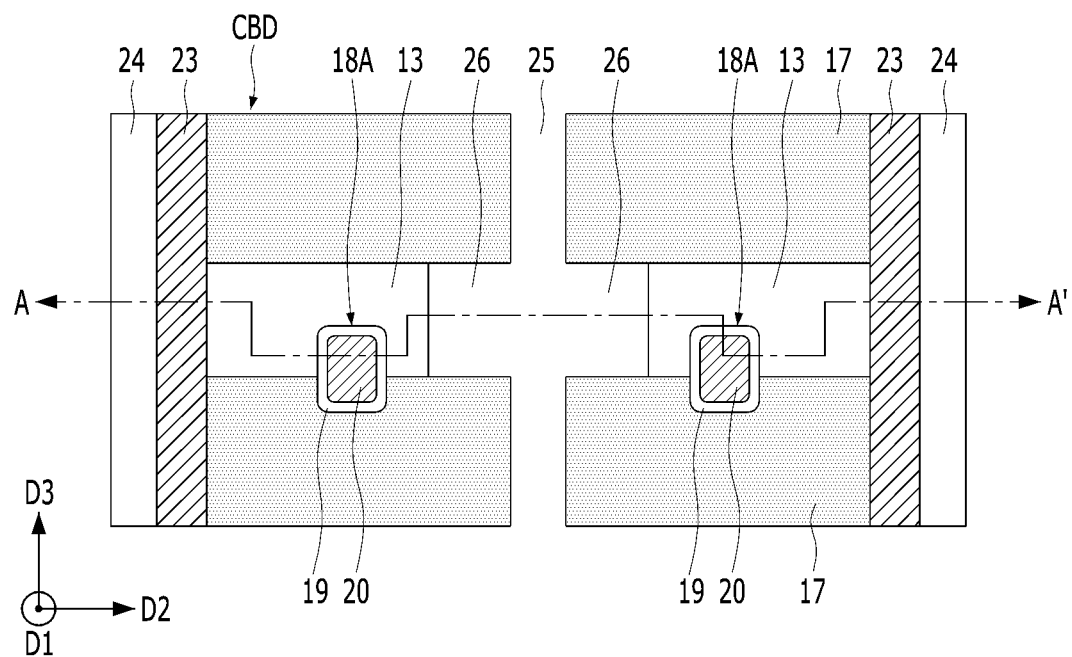
Figure 21B:
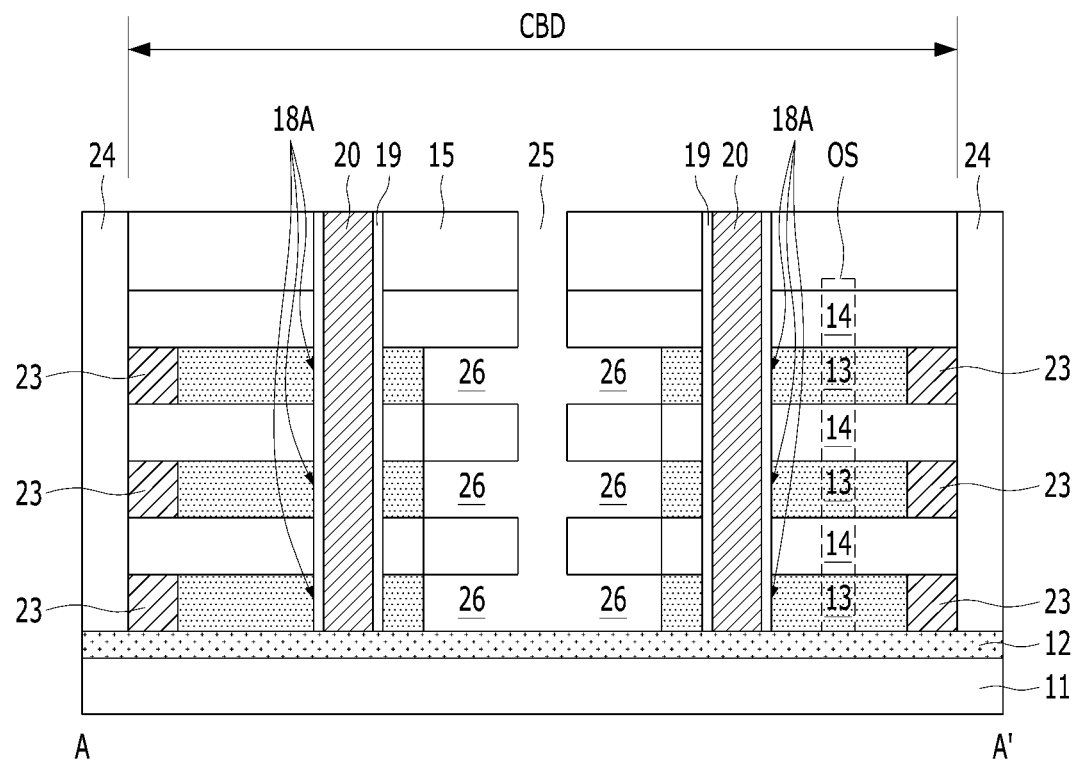

Referring to FIGS. 21A and 21B, the first slit dielectric layer 24 filling the first slits 21 may be formed. The first slit dielectric layer 24 may include silicon nitride.

A second slit 25 may be formed by etching another portion of the cell stack body CBD.

The semiconductor layers 13 of the cell stack body CBD may be horizontally recessed through the second slit 25. As a result, a plurality of second horizontal recesses 26 may be formed. The second horizontal recesses 26 may be disposed between the cell isolation layers 14 in the stacking direction of the cell stack body CBD.

Figure 22A:
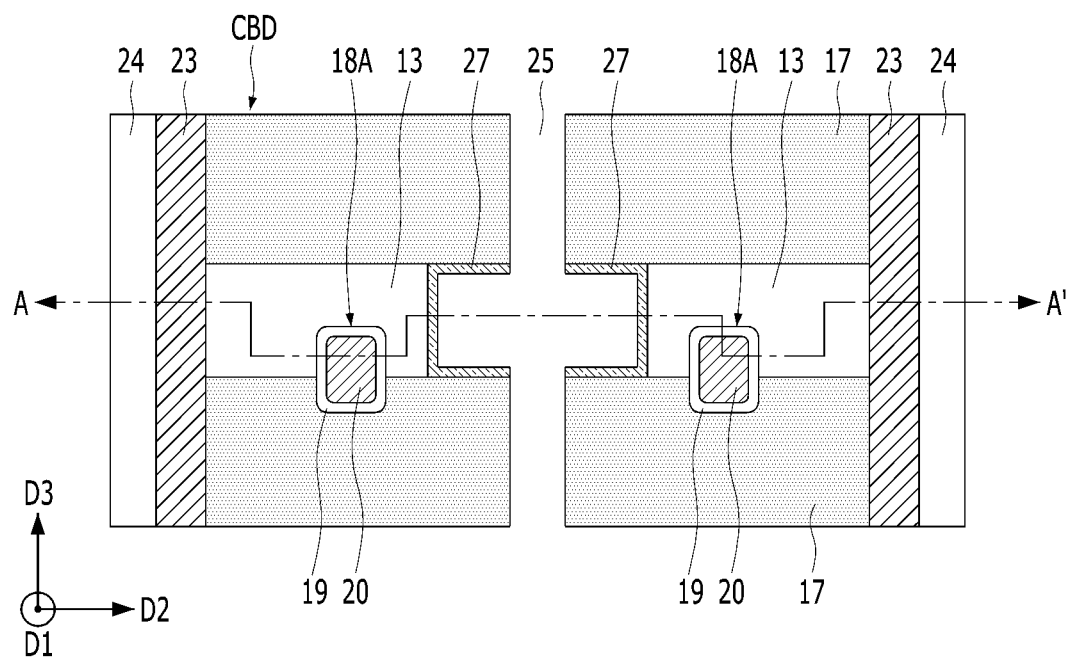
Figure 22B:
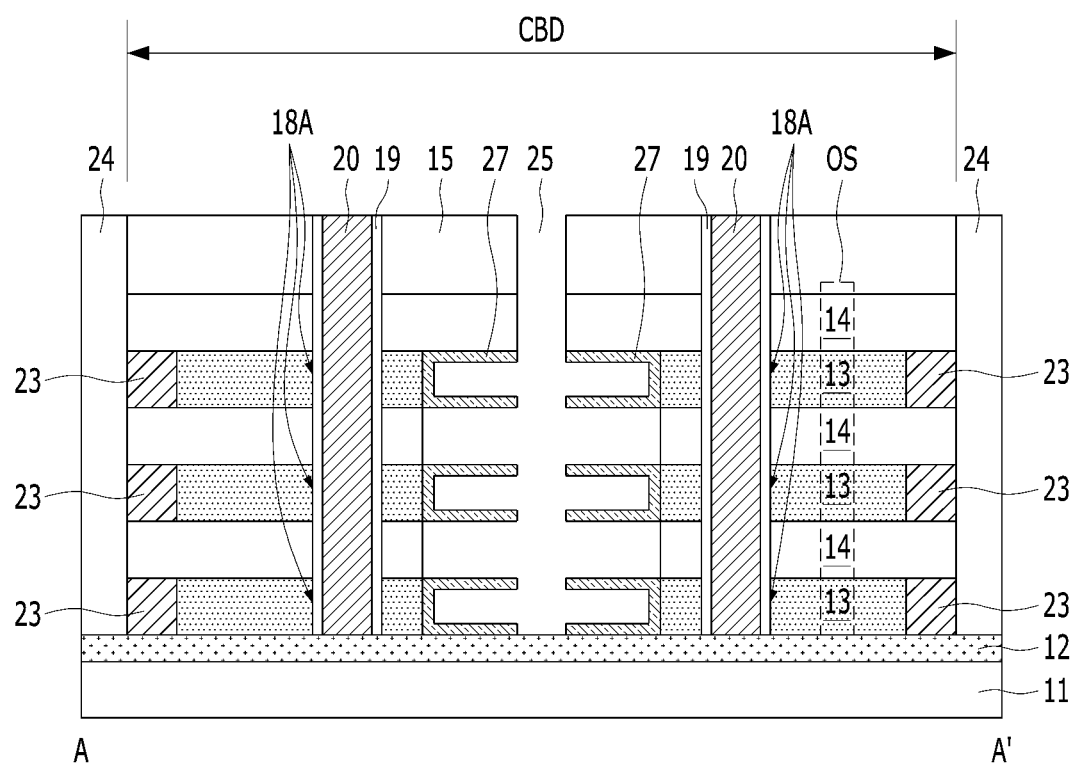

Referring to FIGS. 22A and 22B, a first electrode 27 of the data storage element may be formed in each of the second horizontal recesses 26. The first electrode 27 may include a metal-based material. For example, the process of forming the first electrode 27 may include forming a titanium/titanium nitride stack and etching the titanium/titanium nitride stack. The titanium/titanium nitride stack may be formed by a deposition method with excellent step coverage, such as Atomic Layer Deposition (ALD) and Chemical Vapor Deposition (CVD). The first electrode 27 may be formed to have a thickness of approximately 5 to 10 nm. The first electrode 27 may have a cylindrical shape.

The horizontal conductive lines 23, the semiconductor layers 13, and the first electrodes 27 may be disposed at the same horizontal level.

Figure 23A:
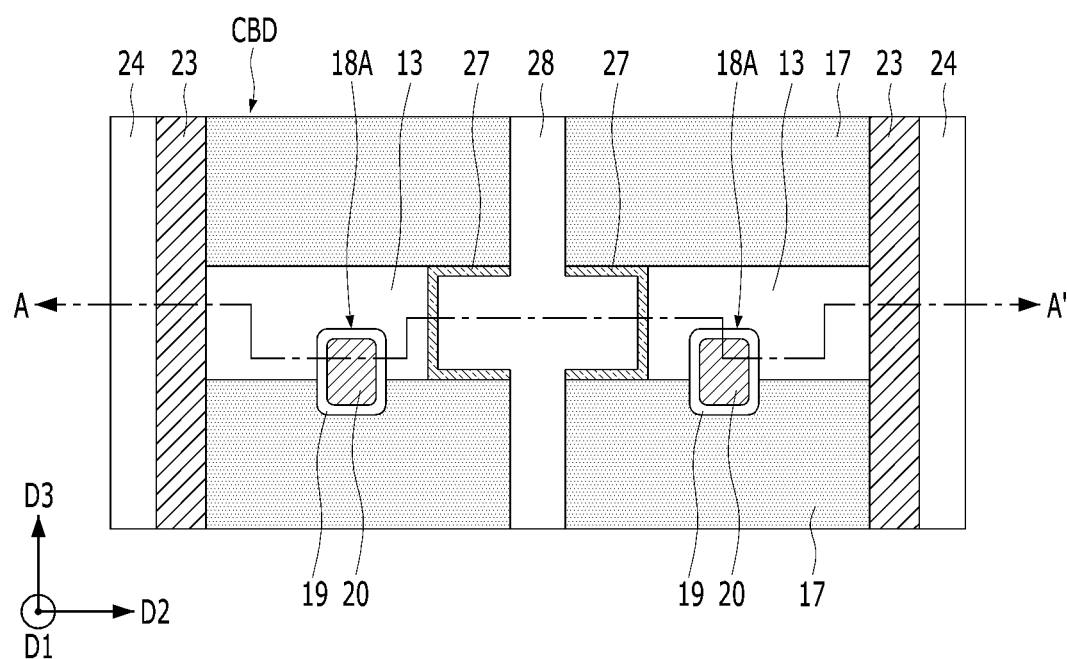
Figure 23B:
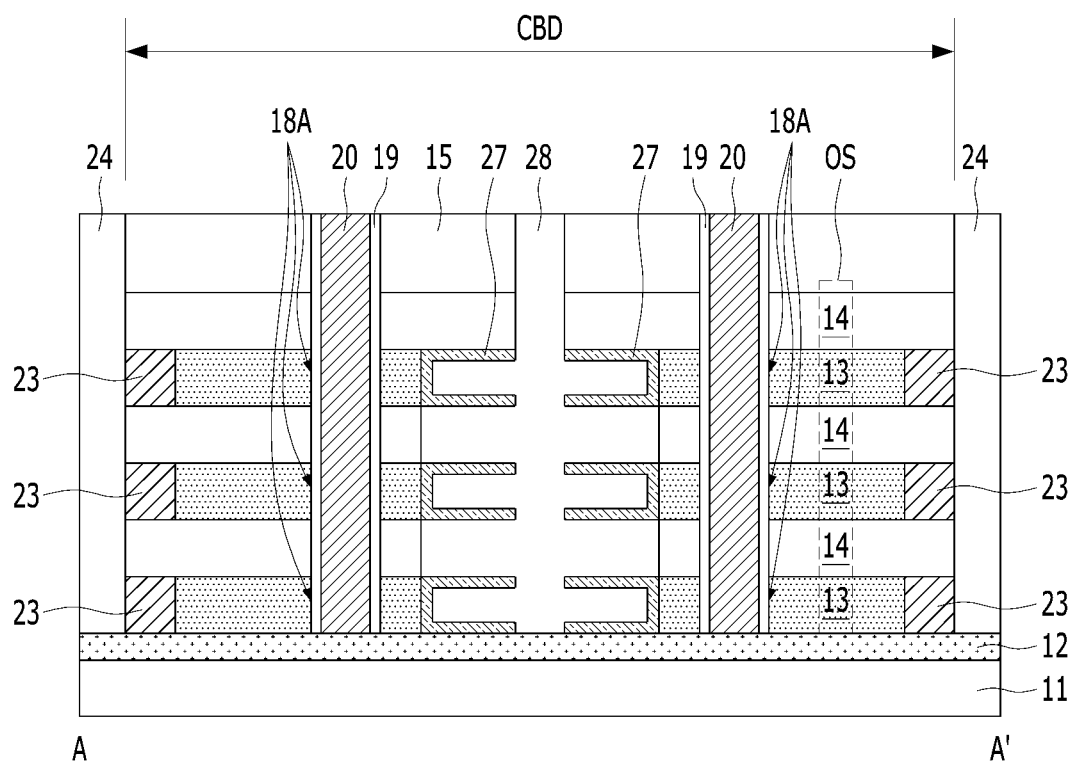

Referring to FIGS. 23A and 23B, a second slit dielectric layer 28 filling the second slits 25 may be formed. The second slit dielectric layer 28 may include, for example, silicon oxide. The second slit dielectric layer 28 may separate the neighboring first electrodes 27 from each other.

Figure 24A:
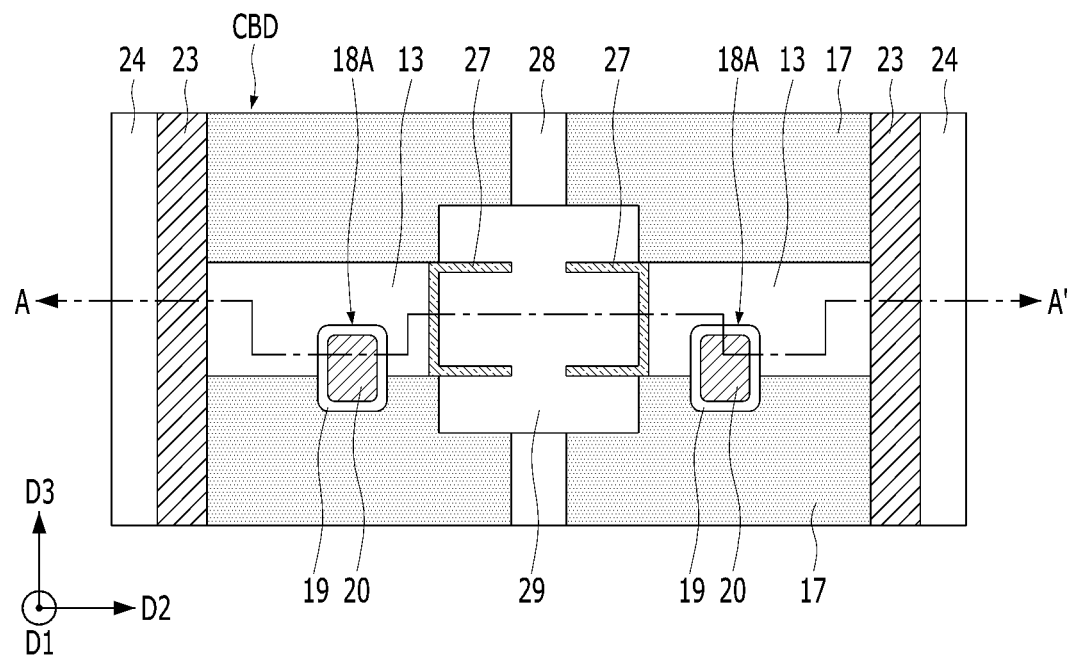
Figure 24B:
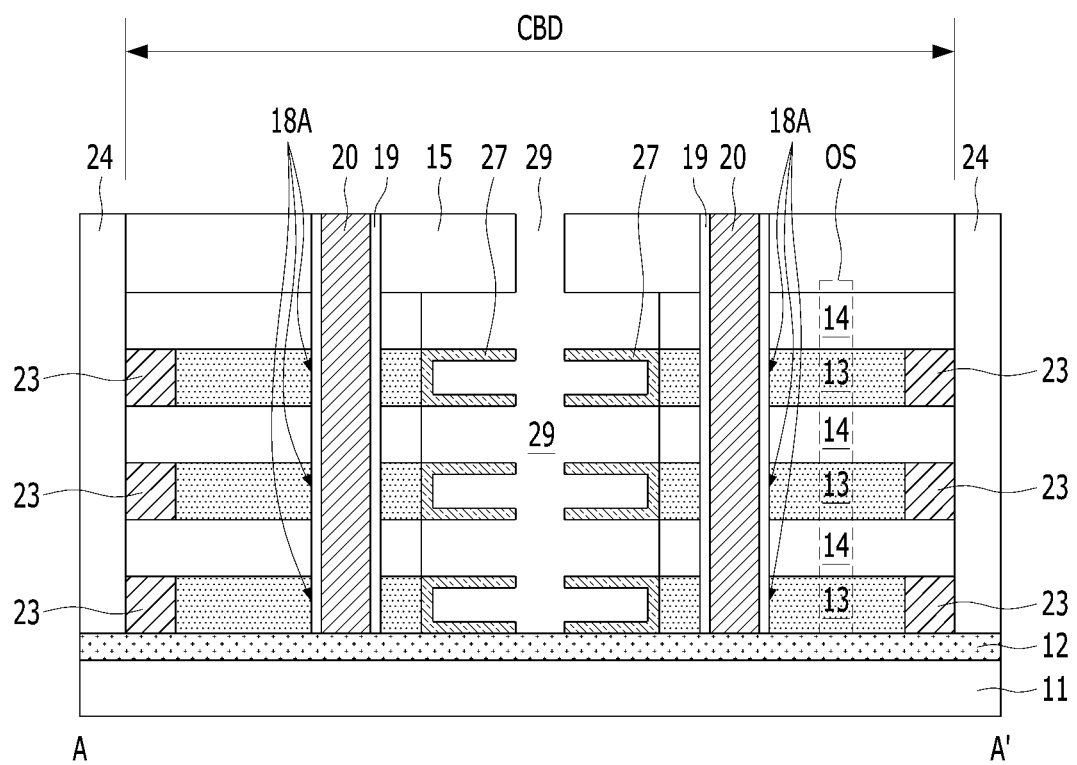

Referring to FIGS. 24A and 24B, the isolation layer 17, the second slit dielectric layer 28, and the cell stack body CBD may be simultaneously etched to form a second vertical opening 29. The etching process for forming the second vertical opening 29 may use a rectangular open mask. To form the second vertical opening 29, a dry etching process and a wet etching process may be sequentially performed. The second vertical opening 29 may expose the outer walls and inner walls of the first electrodes 27. The sidewalls of the first electrodes 27 may contact the semiconductor layers 13.

Figure 25A:
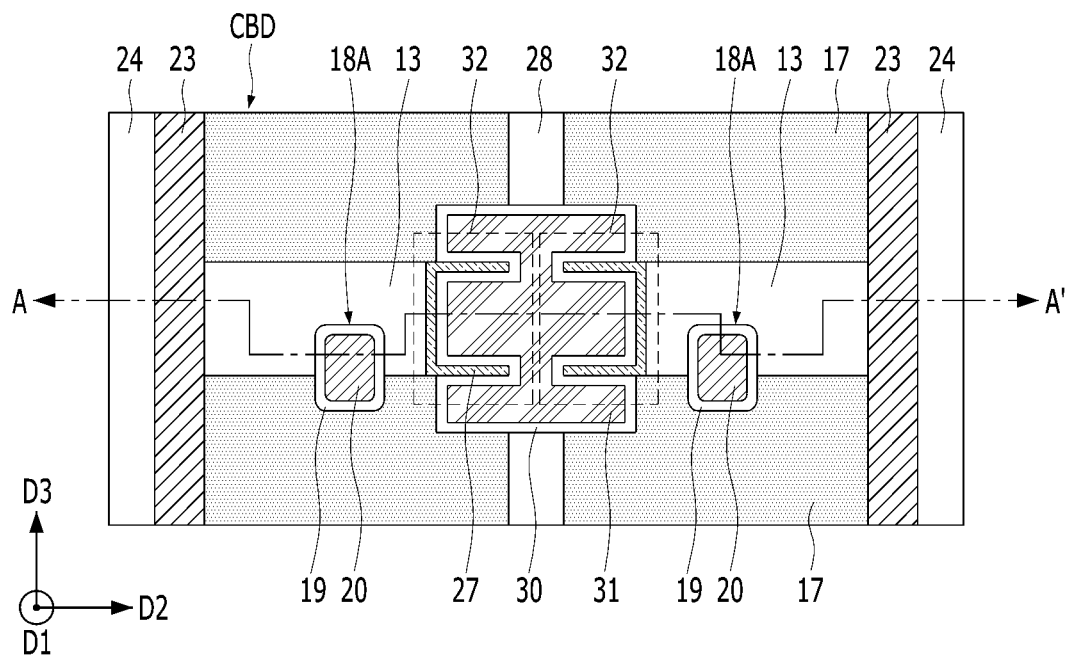
Figure 25B:
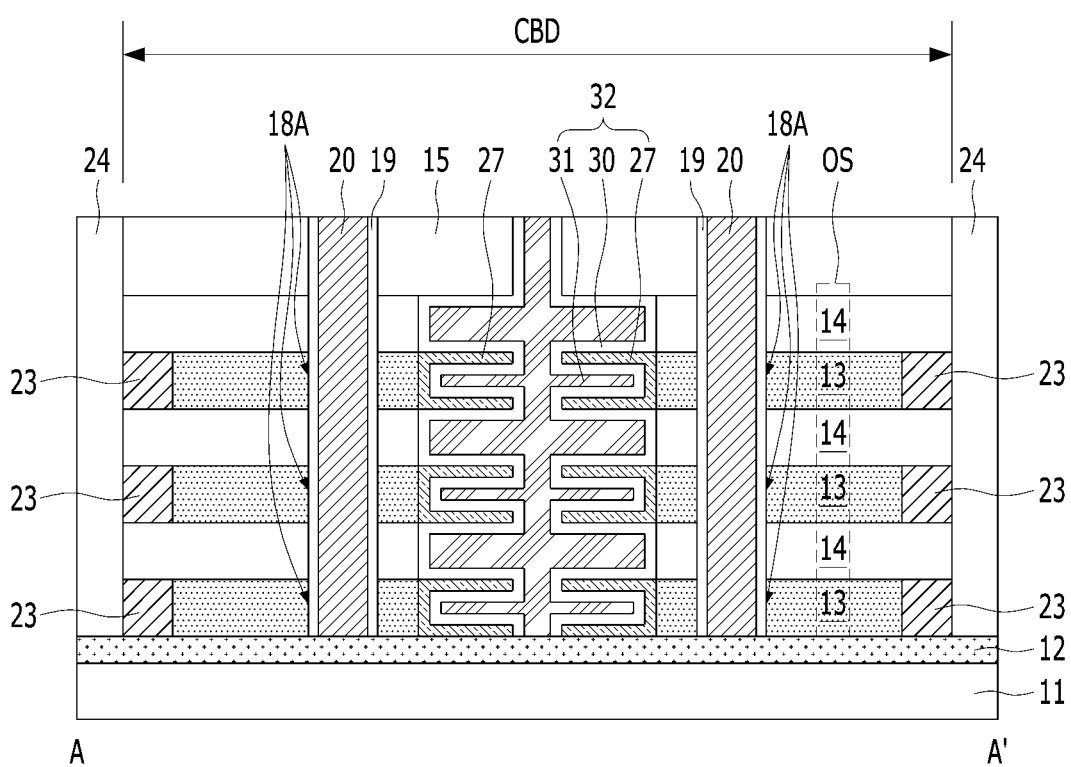

Referring to FIGS. 25A and 25B, a dielectric layer 30 and a second electrode 31 may be sequentially formed over the first electrode 27 through the second vertical opening 29. Accordingly, a plurality of data storage elements 32 including the first electrode 27, the dielectric layer 30, and the second electrode 31 may be formed.

Figure 26A:
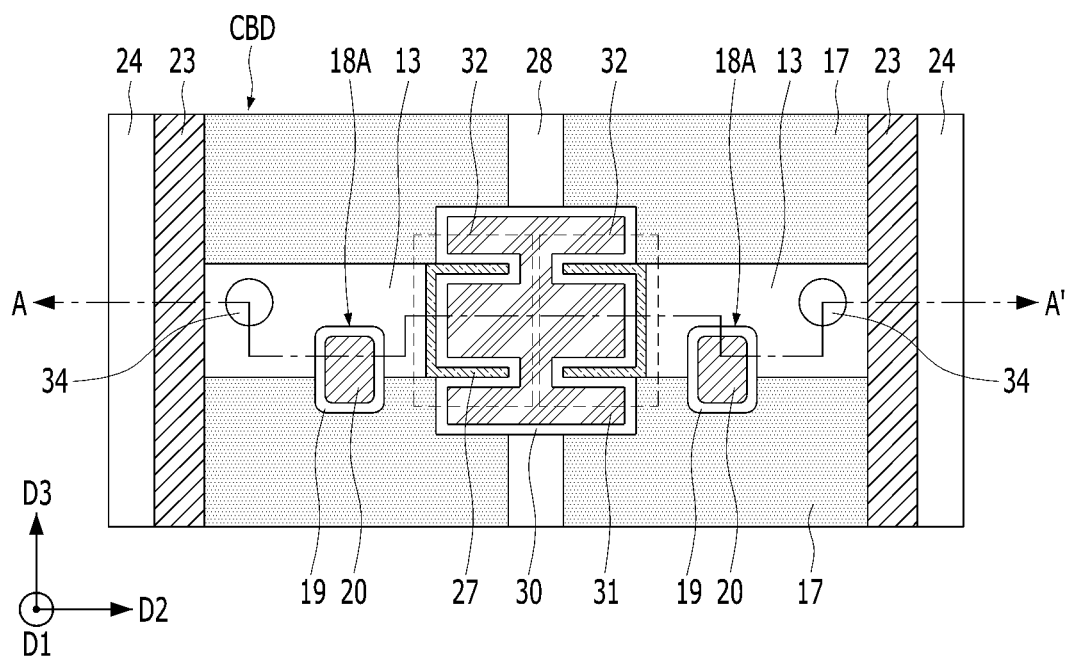
Figure 26B:
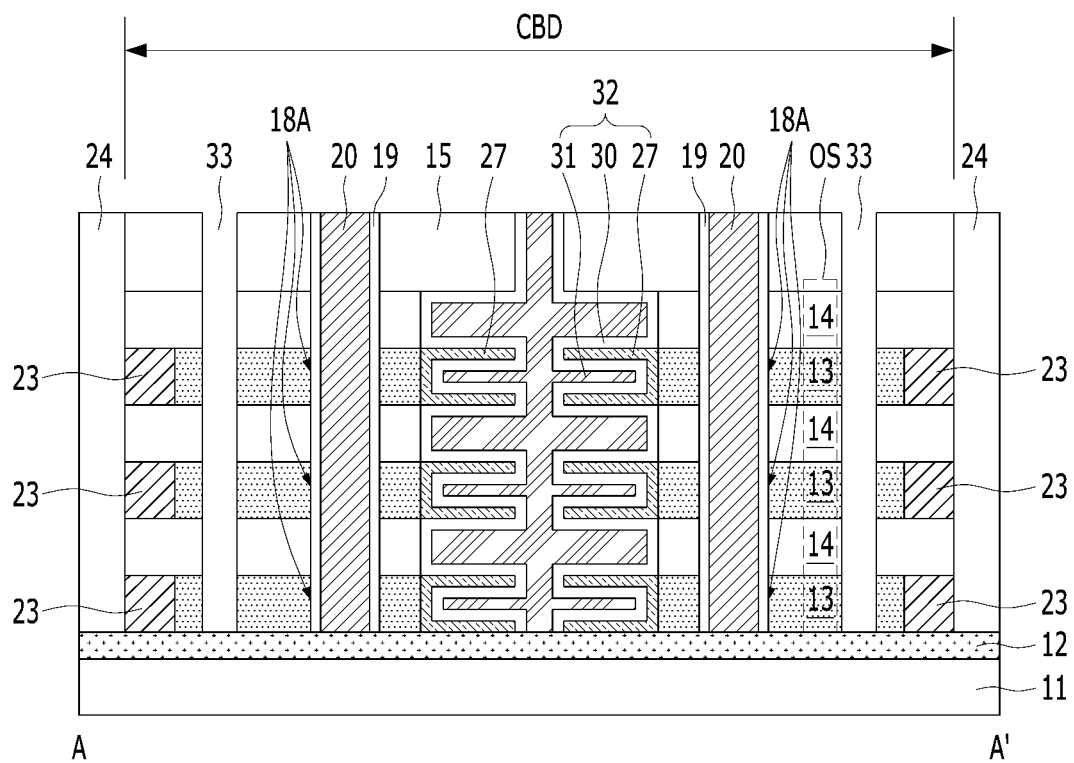

Referring to FIGS. 26A and 26B, third vertical openings 33 may be formed by etching another portion of the cell stack body CBD. The third vertical opening 33 may be adjacent to the horizontal conductive lines 23.

Figure 27A:
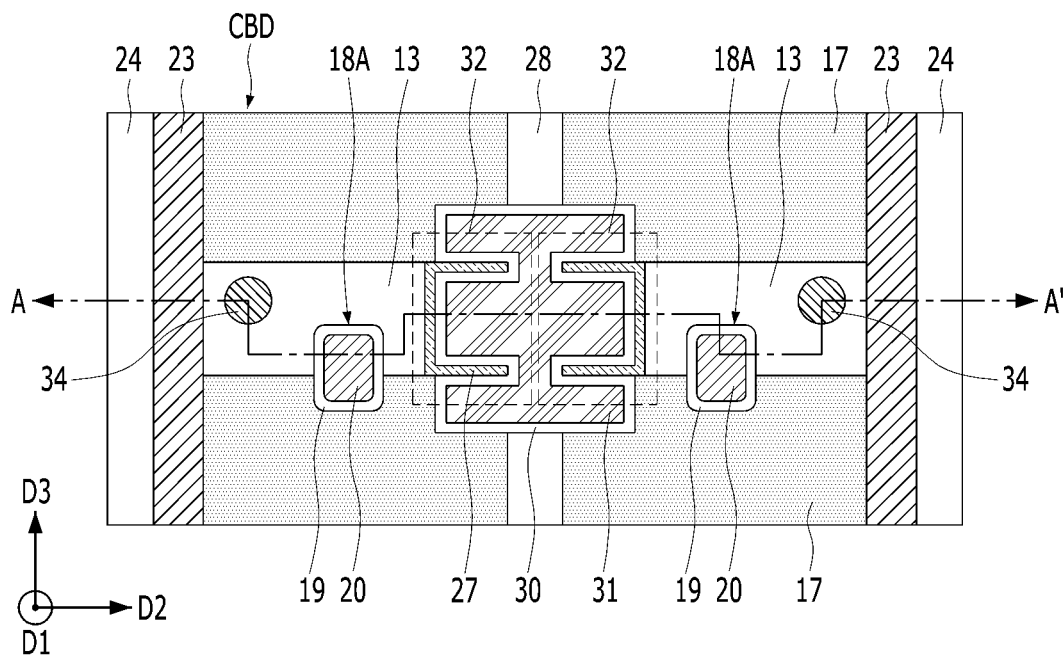
Figure 27B:
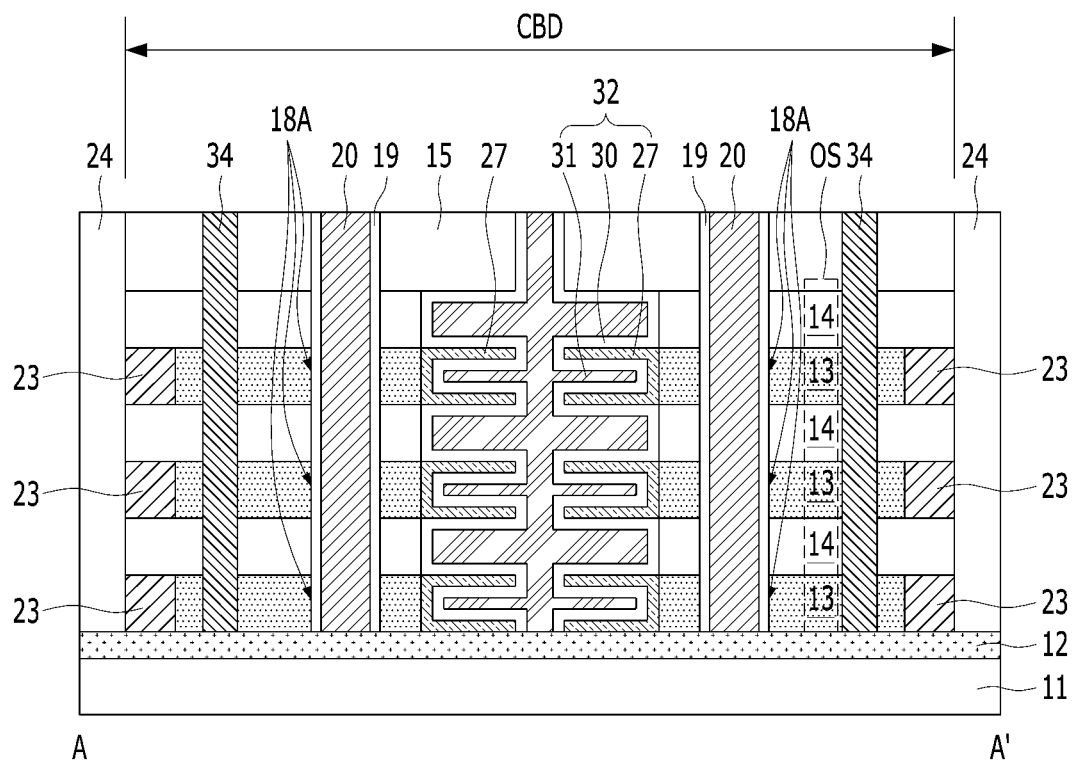

Referring to FIGS. 27A and 27B, a body contact portion 34 filling each third vertical opening 33 may be formed. The semiconductor layers 13 may be coupled in common by the body contact portion 34. In other words, the vertically stacked semiconductor layers 13 may share the body contact portion 34. The body contact portion 34 may include a conductive material. The body contact portion 34 may include a semiconductor material, doped polysilicon, a metal-based material, or a combination thereof.

A method for fabricating the semiconductor devices 800 and 900 as illustrated in FIGS. 13 and 14 may be similar to a series of processes illustrated in FIGS. 15A to 27B. For example, the method for fabricating the semiconductor devices 800 and 900 may include forming a memory cell array MCA in a first substrate; forming a peripheral circuit portion PERI in a second substrate; and bonding the first substrate and the second substrate to each other through the bonding structure WBS. Herein, the forming of the memory cell array MCA may be similar to a series of the processes illustrated in FIGS. 15A to 27B. For example, the process of forming the memory cell array MCA may include: forming an alternating stack of cell isolation layers and horizontal layers; forming a cell stack structure and an isolation structure in the alternating stack; forming a vertical opening in the cell stack structure to form recessed sides on one side of the cell stack structure; forming a vertical conductive line that fills the vertical opening adjacent to the recessed sides; replacing a horizontal conductive line coupled to first ends of the horizontal layers of the cell stack structure; forming data storage elements coupled to second ends of the horizontal layers; and forming a body contact portion vertically penetrating the cell stack structure.

In the embodiments of the present invention described above, the data storage element CAP may be a single cylinder capacitor. According to another embodiment of the present invention, the data storage element CAP may include a double cylinder capacitor.

Figure 28A:
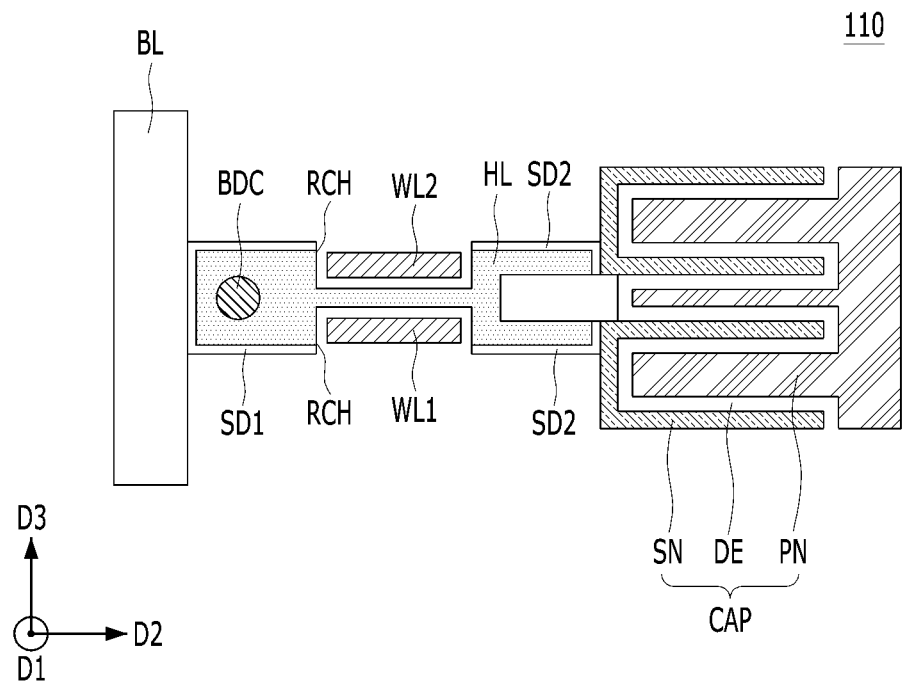
FIGS. 28A and 28B are schematic plan views illustrating a semiconductor device in accordance with another embodiment of the present invention.
Figure 28B:
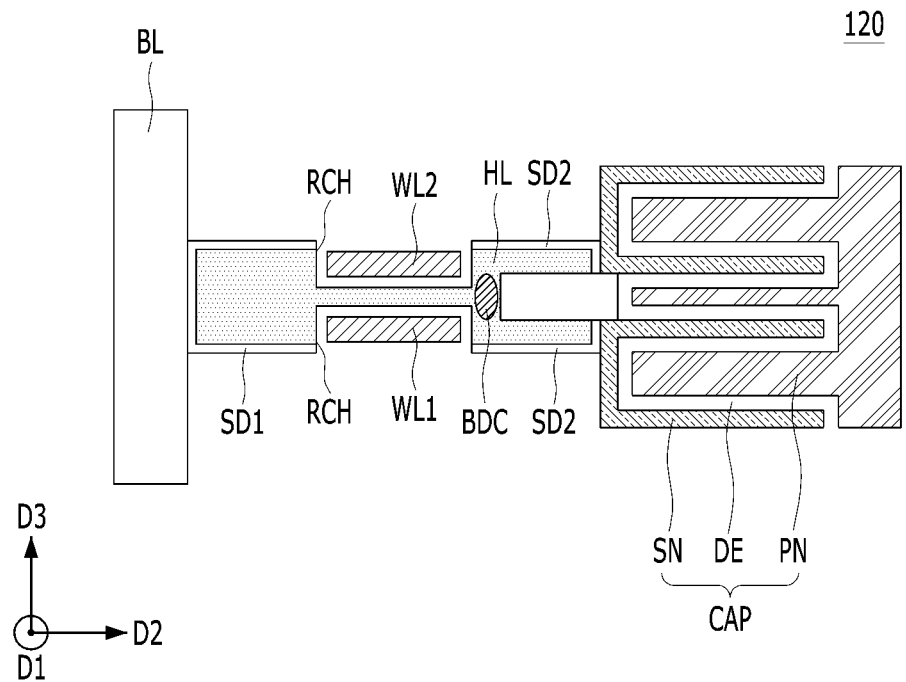

FIGS. 28A and 28B are schematic plan views illustrating a semiconductor device in accordance with another embodiment of the present invention. Referring to FIGS. 28A and 28B, each of the data storage elements CAP of the semiconductor devices 110 and 120 may be a double cylinder capacitor.

Referring to FIGS. 28A and 28B, the semiconductor devices 110 and 120 may include a horizontal conductive line BL horizontally oriented in the third direction D3, a data storage element CAP spaced apart from the horizontal conductive line BL, a double vertical conductive line WL1 and WL2 vertically oriented in the first direction D1 between the horizontal conductive line BL and the data storage element CAP, a horizontal layer HL oriented horizontally in the second direction D2 between the horizontal conductive line BL and the data storage elements CAP and including a double recessed side RCH disposed adjacent to the double vertical conductive lines WL1 and WL2, and a body contact portion BDC vertically oriented in the first direction D1 by penetrating the horizontal layer HL. The data storage element CAP may include a first electrode SN, a dielectric layer DE, and a second electrode PN, and the first electrode SN may have a cylindrical shape. The body contact portion BDC may extend in the first direction D1 by penetrating a portion of the horizontal layer HL. The body contact portion BDC and the horizontal layer HL may be electrically connected to each other. A first doped region SD1 may be formed between the double recessed side RCH and the horizontal conductive line BL, and a second doped region SD2 may be formed between the double recessed side RCH and the first electrode SN. The first doped region SD1 and the second doped region SD2 may be formed in the horizontal layer HL.

The body contact portion BDC of FIG. 28A may be adjacent to the horizontal conductive line BL and the first doped region SD1. The body contact portion BDC of FIG. 28B may be adjacent to the data storage element CAP and the second doped region SD2.

Referring to FIGS. 28A and 28B, the area efficiency may be improved by merging two recessed sides RCH. Also, since the double cylinder capacitor is formed, the capacitance may be increased.

A data storage element CAP as illustrated in FIGS. 1 to 27B may include a double cylinder capacitor.

According to the above-described embodiments of the present invention, when a driving voltage is applied to the vertically oriented vertical conductive line WL and DWL, all the transistors RCT sharing the vertical conductive line WL and DWL may be simultaneously turned on. When the transistors RCT are turned on, data stored in the data storage element CAP may be sensed in each horizontal conductive line BL. Therefore, it is possible to read data by selecting the horizontal conductive line BL of a desired memory cell.

A desired voltage may be applied to the body contact portion BDC for adjusting the body bias of the transistors RCT. For example, all transistors may operate stably by applying a voltage of approximately −0.1V to −0.6V to the body contact portion BDC.

When the thickness of the horizontal layers HL is thin, the concentration of a minor carrier may be low. Therefore, the position or number of the body contact portion BDC may be adjusted. According to another embodiment of the present invention, the body contact portion may be omitted.

According to the embodiments of the present invention described above, by applying the recessed channel transistor, the threshold voltage may be easily adjusted by increasing the channel length. Also, since the distance between the doped regions and the recessed channel is increased, the slope of a junction dopant may be made smooth so as to suppress junction leakage. Also, it is possible to prevent fluctuation of a threshold voltage and an increase in dispersion that may be caused by the floating body effect.

According to the embodiment of the present invention, since a recessed channel transistor is formed, the channel length may be increased, which is advantageous in controlling a threshold voltage.

According to the embodiment of the present invention, since the distance between a doped region (e.g., source/drain region) and a recessed channel is increased, junction leakage may be improved.

According to the embodiment of the present invention, since a body contact portion is formed, it is possible to suppress a floating body effect.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a lower structure;
    a horizontal conductive line which is oriented horizontally over the lower structure;
    a data storage element which is disposed over the lower structure to be spaced from the horizontal conductive line;
    a vertical conductive line which is vertically oriented between the horizontal conductive line and the data storage element;
    a horizontal layer which is oriented horizontally between the horizontal conductive line and the data storage element, and including a recessed side which is disposed adjacent to the vertical conductive line; and
    a body contact portion oriented which is vertically oriented by penetrating the horizontal layer.

2. The semiconductor device of claim 1, wherein the body contact portion includes a conductive material.

3. The semiconductor device of claim 1, wherein the body contact portion includes a semiconductor material, a metal, a metal nitride, a metal silicide, or a combination thereof.

4. The semiconductor device of claim 1, wherein the recessed side includes a first recessed side and a second recessed side that are opposite to each other, and
    the vertical conductive line includes a first vertical conductive line which is adjacent to the first recessed side, and a second vertical conductive line which is adjacent to the second recessed side.

5. The semiconductor device of claim 1, wherein a cross section of the recessed side includes a round shape, a bent shape, or an angled.

6. The semiconductor device of claim 1, wherein the data storage element includes a capacitor.

7. The semiconductor device of claim 1, wherein the horizontal layer includes a semiconductor material, an oxide semiconductor material, monocrystalline silicon, polycrystalline silicon, or a combination thereof.

8. The semiconductor device of claim 1, wherein the horizontal conductive line includes a metal-based material.

9. The semiconductor device of claim 1, further comprising:
    a dielectric layer between the vertical conductive line and the recessed side.

10. The semiconductor device of claim 1, wherein the lower structure includes a semiconductor substrate or a peripheral circuit portion.

11. The semiconductor device of claim 1, wherein the vertical conductive line includes a word line, and
the horizontal conductive line includes a bit line.

12. The semiconductor device of claim 1, wherein the recessed side includes one single recessed side, and
the vertical conductive line includes one single vertical conductive line which is adjacent to the single recessed side.

13. The semiconductor device of claim 1, wherein the data storage elements include a single cylinder capacitor or a double cylinder capacitor.

14. The semiconductor device of claim 13, further comprising:
a wafer bonding structure between the memory cell array and the lower structure.

15. The semiconductor device of claim 14, wherein the wafer bonding structure includes metal-to-metal bonding or hybrid bonding.

16. The semiconductor device of claim 14, wherein the memory cell array and the peripheral circuit portion include a COP (Cell-Over-Peripheral) structure or a POC (Peripheral-Over-Cell) structure.

17. The semiconductor device of claim 1, wherein the horizontal conductive line, the data storage element, the vertical conductive line, the horizontal layer, and the body contact portion form a memory cell of a memory cell array.

18. The semiconductor device of claim 17, wherein the memory cell array includes a Dynamic Random Access Memory (DRAM) cell array.

* * * * *